US009472371B2

(12) United States Patent
Virshup et al.

(10) Patent No.: US 9,472,371 B2
(45) Date of Patent: Oct. 18, 2016

(54) FILAMENT FOR X-RAY CATHODE

(71) Applicant: Varian Medical Systems, Inc., Palo Alto, CA (US)

(72) Inventors: Gary F. Virshup, Cupertino, CA (US); Stephen G. Bandy, Sunnyvale, CA (US); Michael C. Green, Palo Alto, CA (US); Clifford K. Nishimoto, San Jose, CA (US); James R. Boye, Salt Lake City, UT (US)

(73) Assignee: VARIAN MEDICAL SYSTEMS, INC., Palo Alto, CA (US)

( * ) Notice: Subject to any disclaimer, the term of this patent is extended or adjusted under 35 U.S.C. 154(b) by 68 days.

(21) Appl. No.: 14/499,045

(22) Filed: Sep. 26, 2014

(65) Prior Publication Data

US 2016/0093462 A1 Mar. 31, 2016

(51) Int. Cl.

| | |
|---|---|
| ***H01J 9/00*** | (2006.01) |
| ***H01L 51/52*** | (2006.01) |
| ***H01J 35/06*** | (2006.01) |
| ***H01J 9/04*** | (2006.01) |

(52) U.S. Cl.

CPC ................ *H01J 35/06* (2013.01); *H01J 9/042* (2013.01); *H01J 2235/06* (2013.01)

(58) Field of Classification Search

CPC ....... H01J 35/06; H01J 9/042; H01J 2235/06
See application file for complete search history.

(56) References Cited

U.S. PATENT DOCUMENTS

| | | | |
|---|---|---|---|
| 2,919,373 | A | 12/1959 | Riley et al. |
| 4,344,011 | A | 8/1982 | Hayashi et al. |
| 8,385,506 | B2 | 2/2013 | Lemaitre et al. |

OTHER PUBLICATIONS

Taubin, M.L. et al., "X-Ray Tube Cathodes of Medical Purpose", Biomedical Engineering, vol. 43, Nov. 1, 2009, pp. 48-50. Translated from Meditsinskaya Tekhnika, vol. 43, Nov. 1, 2009, pp. 44-47. Original article submitted Apr. 29, 2008.

*Primary Examiner* — Joseph L Williams
(74) *Attorney, Agent, or Firm* — Maschoff Brennan

(57) ABSTRACT

Embodiments include an X-ray cathode filament, filament system, process to manufacture the filament and process to use the filament, where the filament includes a planar substrate, such as of tungsten, having a top surface coated with a coating of carburized tungsten (e.g., $W_2C$) and thoria ($ThO_2$). A first electron beam is emitted from the coating through a thermionic effect at a first temperature, such as when the filament is heated to between 1700 and 1900 degrees Celsius by running an electrical current through the filament. At this temperature, a second electron beam may be caused by (1) a reaction that includes creating thorium (Th) in the coating, and (2) the thorium diffusing to uncoated surfaces of the substrate from which the second electron beam is emitted. The filament may also have slots forming a zipper shape, forming a square switchback shape, or forming a rectangular labyrinth shape to reduce the current required to heat the filament.

21 Claims, 8 Drawing Sheets

FILAMENT FOR X-RAY CATHODE

Embodiments of the present invention are generally related to the field of X-ray tubes, and in particular, to X-ray cathode systems and methods of manufacturing X-ray cathodes. Certain embodiments are related to flat or planar electron emitters of electrons used in X-ray cathodes.

BACKGROUND

X-ray tubes and cathodes (e.g., x-ray sources) may be fabricated in many ways, and may serve many purposes. X-ray tubes typically include an electron source, such as a cathode, that releases electrons at high temperatures. Some of the released electrons may impact a target anode. The collision of the electrons with the target anode produces X-rays, which may be used in a variety of medical devices such as computed tomography (CT) imaging systems, X-ray scanners, and so forth. In thermionic cathode systems, a filament including a metal may be used as an electron source. The filament may be induced to release electrons through the thermionic effect, i.e. in response to being heated. However, thermionic X-ray cathode filaments typically may not emit electrons until after being heated to a high temperature at which the material of the filament evaporates, thus reducing its operating life. For flat or planar filaments, this may quickly cause inconsistent electron emission and eventual cathode failure as the filament thins.

SUMMARY

Embodiments of the invention pertain to X-ray cathode filaments, filament systems, process to manufacture filaments and process to use filaments, where the filament includes a planar substrate, such as of tungsten, having a top surface that includes (e.g., is coated with) a coating of carburized tungsten (e.g., $W_2C$) and thoria ($ThO_2$). A first electron beam is emitted from the coating through a thermionic effect at a first temperature, such as when the filament is heated to between 1800 and 1900 degrees Celsius by running a first electrical current through the filament. The first electron beam is emitted at the first temperature, which is lower than a temperature required to emit a beam from the substrate, due to the coating material having a lower work function than the substrate material.

In addition, when the filament is heated to the first temperature, a second electron beam may be emitted due (1) a reaction that includes creating thorium (Th) in the coating, and (2) the thorium diffusing to uncoated surfaces of the substrate from which the second electron beam is emitted. More specifically, the second electron beam is caused by (1) a reaction that includes creating thorium (Th), carbon monoxide (CO) and tungsten (W) in the coating, and (2) the created thorium diffusing to uncoated surfaces of the substrate. The second electron beam may be emitted at the first temperature due to uncoated surfaces of the substrate that the thorium (Th) diffuses to having a lower work function than the substrate material without the thorium. For example, emission of the first and second beam occurs at the lower first temperature (e.g., possibly between 1600 and 1900 degrees Celsius) than a higher temperature (2300-2500 degree Celsius) that is required to emit an electron beam from the tungsten substrate material that is not coated and that the thorium does not diffuse to.

In some cases, during use, the filament is heated to the first temperature by running a sufficient electrical current between two contacts that are at opposing sides or corners of the filament to cause the coating to emit the electron beam. In some embodiments, the filament may have slots or slices through the filament material to lengthen the path of the current between the contacts, thus reducing the amount or magnitude of electrical current required to heat the filament to cause the coating to emit the beam. In some cases, the slots form a zipper shape, form a square switchback shape, or form a rectangular labyrinth shape.

Embodiments also include a process for forming a flat or planar thermionic filament substrate having a coating as disposed on a top surface of the substrate.

Embodiments also include a process of operating a flat or planar thermionic filament substrate having a coating disposed on a top surface of the substrate.

Other embodiments are also described.

BRIEF DESCRIPTION OF THE DRAWINGS

The embodiments of the invention are illustrated by way of example and not by way of limitation in the Figures of the accompanying drawings in which like references indicate similar elements.

DETAILED DESCRIPTION

Figure 1:
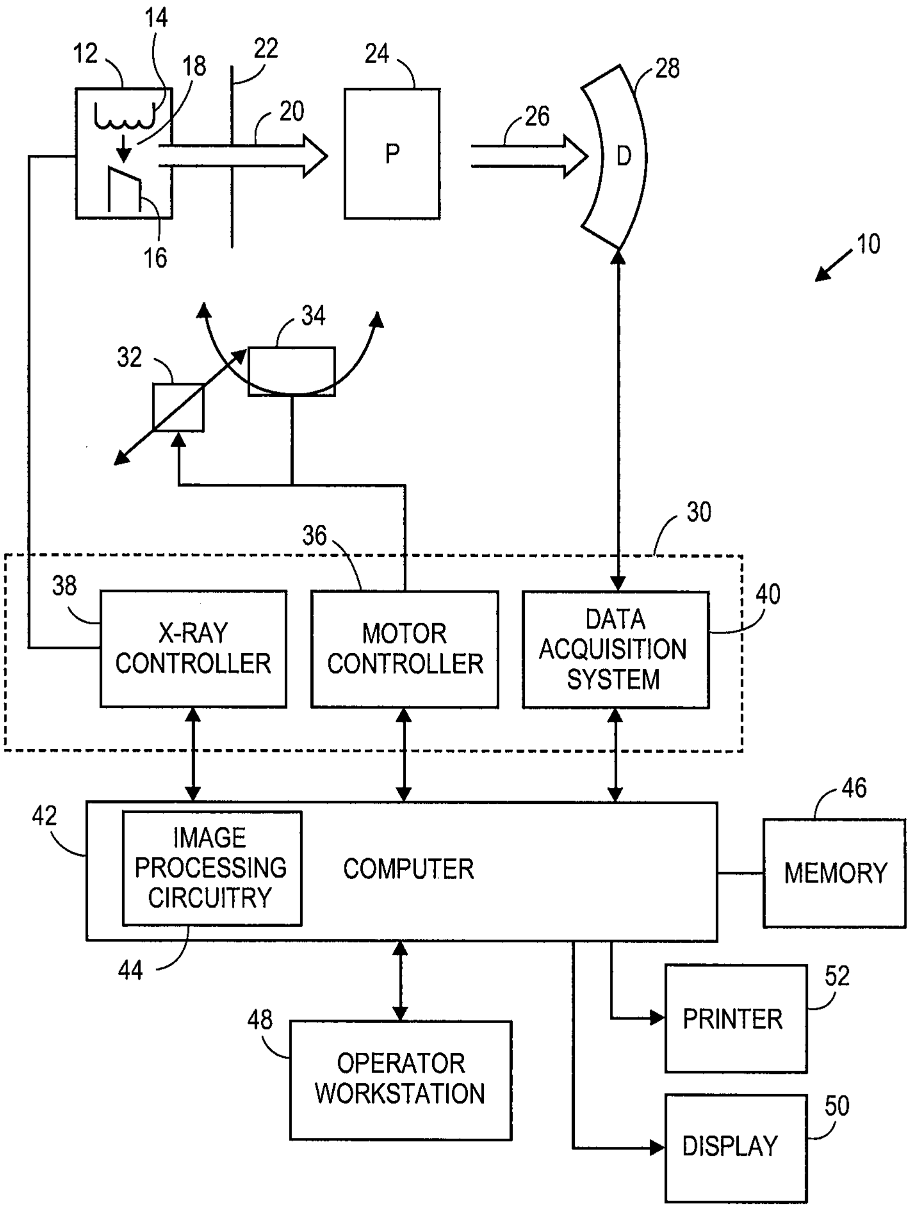
FIG. 1 illustrates one embodiment of a CT imaging system.

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In some instances, well known components or methods have not been described in detail in order to avoid unnecessarily obscuring the present invention. Similarly, in some instances, well-known circuits, structures, and techniques have not been shown in detail so as not to obscure the understanding of this description.

In certain X-ray cathode assemblies, a flat or planar thermionic filament emitter may be employed to emit a stream of electrons, such as for an X-ray cathode assembly. Such a filament may be induced to release electrons from the filament's surface through the application of heat energy (e.g., through a "thermionic effect"). The hotter the filament material, the greater the number of electron that may be emitted. The filament material may be chosen for its ability to generate electrons through the thermionic effect and for its ability withstand high heat. The filament material may be chosen to be tungsten or a tungsten derivative such as doped tungsten (i.e., tungsten with added impurities) because tungsten has a very high melting point, a very low vapor pressure, and a relatively low work function (i.e., a measure of the minimum energy required to induce an electron to leave a material). In addition, coated tungsten filaments, as described herein, may emit electron beams at lower temperatures, and may emit higher electron beam densities at a certain temperature, as compared filaments of uncoated tungsten. Thus, X-ray tubes employing coated tungsten filaments as disclosed herein, may be capable of generating an X-ray output at a lower cathode temperature, or generate a higher X-ray output at a certain temperature, as compared to X-ray tubes employing uncoated tungsten filaments.

More specifically, one type of flat electron emitter (e.g., filament) is a "patterned sheet" of tungsten material. Such a pattern may include the filaments, shapes and/or formations described herein, such as with respect to FIGS. 5-8. As current flows through the pattern the substrate material (i.e., a shape of the planar top surface of the tungsten material of the substrate, such as defined from above) will heat through ohmic heating to a temperature at which the tungsten will emit electrons. This may be done through a process called thermionic emission. The current density J of the emitted electrons follows the equation (equation 1):

$$J = A_G T^2 e^{-\frac{W}{kT}} \tag{1}$$

where T is the Temperature (in Kelvin and Celsius=Kelvin—273.15), W is the work function, k is the Boltzmann constant, and $A_G$ is a material specific correction factor. The total current from the flat emitter is an integral of the current density combined with a temperature map of the emitter. The Temperature map is controlled by the current flowing through the pattern, the relative cross sectional area of the emitter's material, the thermal emissivity and thermal conductivity of the substrate material.

In the application of X-ray tubes the values of J desired for a useable emitter may be at least 0.2 to 8 Amperes/cm2, which for Tungsten with a W (work function)=4.52 eV (electron Volts), can result in temperatures in excess of 2500° Celsius (C). One disadvantage of this high operating temperature is that the Tungsten material will evaporate at a high rate and the substrate material will thin and finally the continuity of the current flow will be interrupted and the emitter will no longer operate at all. In some cases, such emitters must be heated at such high temperatures to emit electrons that the emitters are evaporating during the operating life of the cathode and reduce the useful life of the emitter. In some cases, the life may be reduced to only 5-10 hours, or to less than 30 hours of emitting electrons, and may depend on the application or use of the cathode. In practice the pattern's temperature map (e.g., a plot or map of temperature along the top surface area of the planar emitter) will change during operation as some parts become more resistive (e.g., capturing higher heat from the current flow) than others due to the high operating temperatures of the more resistive parts. Typically it is of value to have a non-changing (e.g., "homogeneous") spatial source of electrons (e.g., along the planar surface of the emitter), which results from a non-changing distribution of filament resistance and hence a non-changing distribution of local temperature (e.g., along the planar surface of the emitter).

According to some embodiments, in order to reduce the temperature related change in temperature map, and thus the changing spatial source of electrons, it is possible to coat the tungsten substrate material with a coating of Thoria which through processing will result in a lower work function surface of the emitter. One such coating includes a tungsten material with a low percentage of Thoria ($ThO_2$), such as where the percentage of Thoria is between 0.1 and 5.0 percent by weight of the coating. This coating when processed properly, such as by carburizing the tungsten, will result in a work function of between 2.7 and 3.1 eV. The resulting temperatures required to heat the cathode to emit the electrons would then drop from approximately 2300-2500° C. to between 1700-1900° C. At that temperature the amount of tungsten evaporated due to or based on temperature heating to perform the thermionic emission of electrons is tens to hundreds of times less than without the coating. Thus, the amount of tungsten evaporated becomes a non issue or not relevant to evaporation of filament material or changing the temperature map.

In some cases, the processing of the coating or coated material (and the base or substrate material) includes an activation process where a coating that is applied to the substrate (e.g., a low percentage of Thoria ($ThO_2$); or tungsten (W) with low percentage of Thoria) is carburized to create a "coating" (e.g., a carburized material) of thoriated ditungsten carbide ($ThO_2$ $W_2C$). This coating enables a chemical reaction during use (e.g., when the coating is heated) which converts the $2W_2C+ThO_2$ into Th (Thorium) and 2CO+4W. Thus, some embodiments described herein use $ThO_2$ in a coating of flat carburized tungsten electron emitters of X-ray cathode assemblies to reduce the operating temperature while retaining the superior mechanical, electrical and thermal properties of the Tungsten base material or substrate.

FIG. 1 illustrates one embodiment of a CT imaging system. FIG. 1 illustrates imaging system 10 for acquiring and processing image data. System 10 may be a computed tomography (CT) system designed to acquire X-ray projection data, to reconstruct the projection data into a tomographic image, and to process the image data for further analysis (e.g., treatment planning calculations, etc.) and/or display (e.g., for system user analysis). Though imaging system 10 is discussed in the context of medical imaging, the techniques and configurations discussed herein are applicable in other non-invasive imaging contexts, such as baggage or package screening or industrial nondestructive evaluation of manufactured parts. CT imaging system 10 is shown including X-ray source 12 which may include one or more conventional X-ray sources, such as an X-ray tube. Source 12 may include an X-ray tube with a cathode assembly 14 and an anode 16 as described in more detail with respect to FIG. 2 below. In some cases, cathode assembly 14 and anode 16 are separated by a voltage (typically between 20 kV and 140 kV) which will accelerate a stream of electrons 18 (i.e., an electron beam), emitted from the cathode assembly 14, some of which may impact the target anode 16. The electron beam 18 impacting on the anode 16 causes the emission of X-ray beam 20.

Source 12 may be positioned proximate to a collimator 22. Collimator 22 may consist of one or more collimating regions, such as lead or tungsten shutters, for each emission point of source 12. Collimator 22 typically defines the size and shape of the one or more X-ray beams 20 that pass into a region in which a subject 24 or object is positioned. Each X-ray beam 20 may be generally fan-shaped or cone-shaped, depending on the configuration of the detector array and/or the desired method of data acquisition (or treatment for a therapeutic treatment beam). An attenuated portion 26 of each X-ray beam 20 passes through the subject or object, and impacts a detector array, represented generally at reference numeral 28.

Detector 28 may be generally formed by a plurality of detector elements that detect the X-ray beams 20 after they pass through or around a subject or object placed in the field of view of the imaging system 10. Each detector element may produce an electrical signal that represents the intensity of the X-ray beam incident at the position of the detector element when the beam strikes detector 28. The electrical signals may be acquired and processed by a computer to generate one or more scan datasets or images.

System controller 30 may command operation of imaging system 10 to execute examination and/or calibration protocols and to process the acquired data (e.g., datasets). Source 12 is typically controlled by system controller 30. Generally, the system controller 30 may furnish power, focal spot location, control signals and so forth, for the X-ray examination sequences (e.g., including for the use of source 12 and detector 28). Detector 28 may be coupled to system controller 30, which commands acquisition of the signals generated by detector 28. System controller 30 may also execute various signal processing and filtration functions.

In some cases, system controller 30 may control the movement of linear positioning subsystem 32 and rotational subsystem 34 via motor controller 36. In an embodiment where imaging system 10 includes rotation or movement of source 12 and/or detector 28, rotational subsystem 34 may rotate source 12, collimator 22, and/or detector 28 about subject 24. The linear positioning subsystem 32 may displace one or more components of collimator 22, so as to adjust the shape and/or direction of X-ray beam 20. In some embodiments, source 12 may be controlled by X-ray controller 38 disposed within the system controller 30.

Further, the system controller 30 may comprise a data acquisition system (DAS) 40 to receive analog data collected by readout electronics of detector 28 and convert the data to digital signals for subsequent processing by a processor-based system, such as a computer 42. Alternatively, detector 28 may convert the sampled analog signals to digital signals prior to transmission to data acquisition system 40. System 40 or computer 42 may produce images of the target or particular areas of the subject or object based on or using the digital signals.

Computer 42 may be coupled to the system controller 30. The data collected by data acquisition system 40 may be transmitted to computer 42 for subsequent processing. Computer 42 may also be adapted to control features enabled by the system controller 30 (i.e., scanning operations and data acquisition). Furthermore, computer 42 may be configured to receive commands and scanning parameters from an operator via an operator workstation 48. Computer 42 and/or workstation 48 may be equipped with a keyboard and/or other input devices, display 50 and printer 52. An operator may, thereby, control the system 10 via operator workstation 48.

Figure 2:
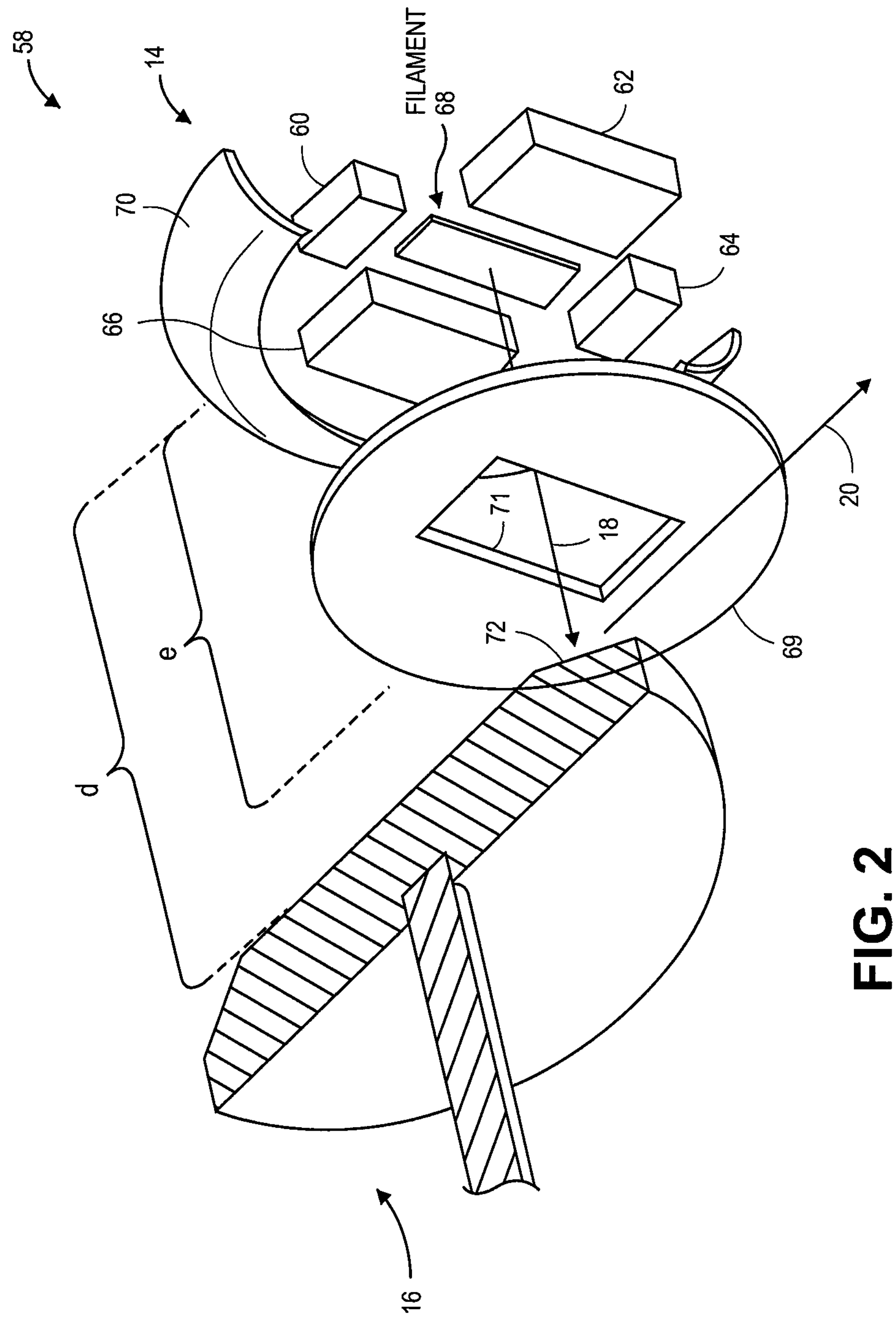
FIG. 2 illustrates one embodiment of an X-ray tube assembly, including an anode and a cathode assembly.

FIG. 2 illustrates one embodiment of an X-ray tube assembly, including an anode and a cathode assembly. FIG. 2 depicts an embodiment of an X-ray tube assembly 58, including embodiments of the cathode assembly 14 and the anode 16 shown in FIG. 1. As shown, the cathode assembly 14 and the target anode 16 are placed at a cathode-target distance d away from each other, and are oriented towards each other. The cathode assembly 14 may include a set of bias electrodes (i.e., deflection electrodes) 60, 62, 64, 66, a filament 68, an extraction electrode 69 and a shield 70 described in more detail with respect to FIG. 3 below. The anode 16 may be manufactured of any suitable metal or composite, including tungsten, or molybdenum. The anode's surface material is typically selected to have a relatively high refractory value so as to withstand the heat generated by electrons (e.g., from the filament) impacting the anode 16. In certain embodiments, the anode 16 may be a rotating disk, as illustrated.

The cathode assembly 14, i.e., electron source, may be positioned a cathode-target distance away from the anode 16 so that the electron beam 18 generated by the cathode assembly 14 (e.g., from filament 68) is focused on a focal spot 72 on the anode 16. The space between the cathode assembly 14 and the anode 16 is typically evacuated in order to minimize electron collisions with other atoms and to maximize an electric potential. A strong electric potential is typically created between the cathode 14 and the anode 16, causing electrons emitted by the cathode 14 through the thermionic effect to become strongly attracted to the anode 16. The resulting electron beam 18 is directed toward the anode 16. The resulting electron bombardment of the focal spot 72 will generate an X-ray beam 20 through the Bremsstrahlung effect, i.e., braking radiation.

In certain embodiments, the extraction electrode 69 is included and is disposed between the cathode assembly 14 and the anode 16. The extraction electrode 69 includes an opening 71 to allow for the passage of electrons through the extraction electrode 69. The extraction electrode may be positioned at a cathode-electrode distance e away from the cathode assembly 14. The cathode-electrode distance e may also be a factor in determining focal spot 72 characteristics such as length and width, and accordingly, the imaging capabilities of the generated X-ray beam 20.

Figure 3:
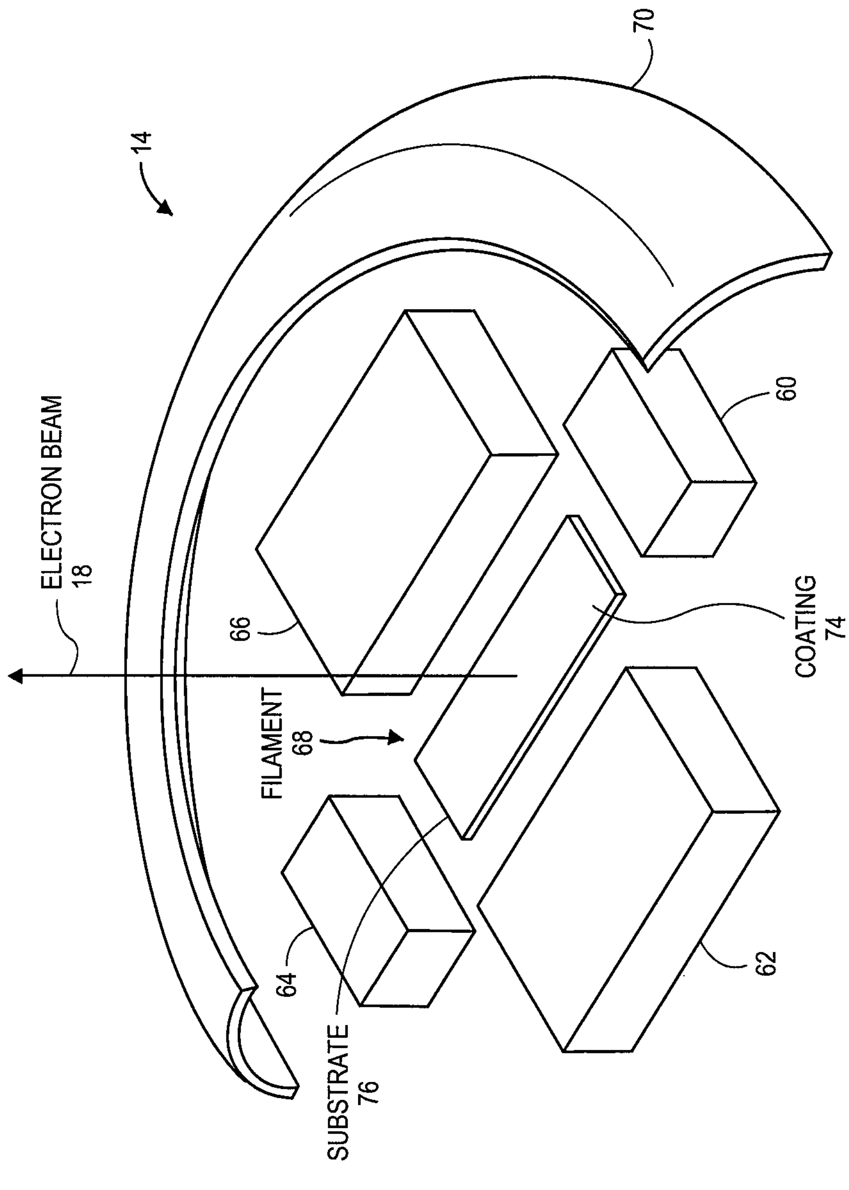
FIG. 3 illustrates one embodiment of a cathode assembly including a coated thermionic filament.

FIG. 3 illustrates one embodiment of a cathode assembly including a coated thermionic filament. FIG. 3 illustrates an embodiment of X-ray cathode assembly 14 having cathode filament which is a coated, flat thermionic filament. According to embodiments, filament 68 in FIGS. 1-3 may be or represent any embodiment of a cathode filament as described herein, such as filament 68, 68*a*, 68*b*, 68*c*, or a filament with respect to FIGS. 5-8.

Figure 4:
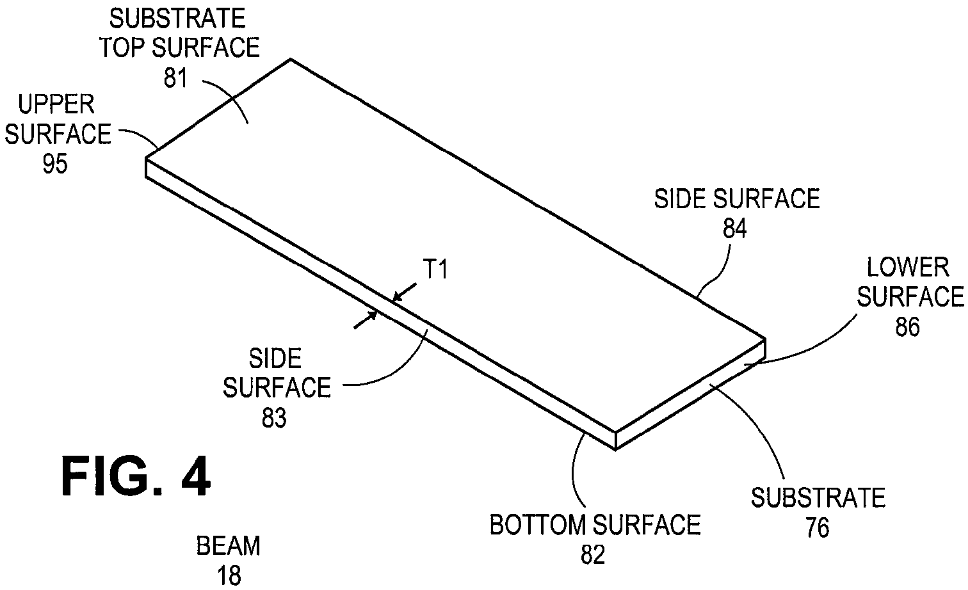
FIG. 4 illustrates one embodiment of a substrate of a thermionic filament having a flat or planar shape.

FIG. 4 illustrates one embodiment of a substrate of a thermionic filament having a flat or planar shape. FIG. 4 shows substrate 76 having planar substrate top surface 81 and opposing planar bottom surface 82. Substrate 76 also includes side surface 83 and opposing side surface 84; upper surface 85 and opposing lower surface 86. Surfaces 83-86 may be planar side or "edge" surfaces between top surface 81 and bottom surface 82.

Substrate 76 is shown having thickness T1. Substrate 76 may be or include a conductive material or metal. In some cases, substrate 76 is or includes tungsten, tungsten carbide, di-tungsten carbide, or tantalum. Substrate 76 may be manufactured in the form of a planar substrate, square or a rectangle of a material such as tungsten, tungsten carbide, di-tungsten carbide, or tantalum. It is to be understood that the substrate 76 may have other shapes, such as a triangle, an oval disk, a circular disc, a flat disk, a curved disk and so forth.

Figure 5:
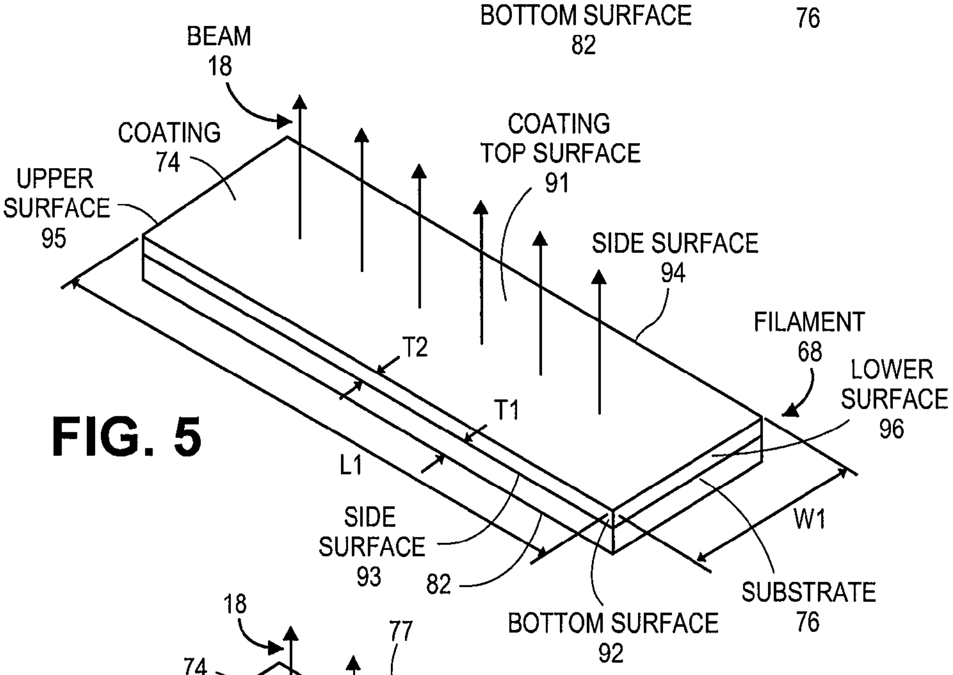
FIG. 5 illustrates one embodiment of a flat or planar thermionic filament substrate having a coating disposed on a top surface of the substrate.

FIG. 5 illustrates one embodiment of a flat or planar thermionic filament substrate having a coating disposed on a top surface of the substrate. FIG. 5 shows filament 68 having substrate 76 coated with coating 74. Filament 68 (e.g., substrate 76 and possibly coating 74) is shown having length L1 and width W1. In some cases, L1 is between 3 mm to 15 mm. In some cases, W1 is between 3 mm to 15 mm. In some cases, each of L1 and W1 are between 4 mm and 10 mm. In some cases, L1 and W1 are equal. In some cases, L1 is greater than W1. In some cases, L1 is between 4 mm and 10 mm. In some cases, W1 is between 4 mm and 10 mm. In some cases, L1 is between 4 mm to 10 mm; and W1 is between 3 mm to 6 mm. FIG. 5 shows coating 74 having planar coating top surface 91 and opposing planar bottom surface 92. Coating 74 also includes side surface 93 and opposing side surface 94; upper surface 95 and opposing lower surface 96. Surfaces 93-96 may be planar side or "edge" surfaces between top surface 91 and bottom surface 92. In some cases, surface 91 or a coated surface of the substrate is defined as a surface of the filament that is more in proximity to the anode. In some cases, surface 91 or a coated surface emitting the beam at the first temperature is defined as a surface of the filament that is closest to or disposed facing the anode.

According to embodiments, filament 68 includes coating 74 disposed on (e.g., touching or coated onto) substrate 76. Coating 74 is shown formed on or touching top surface 81 of substrate 76, such as by having bottom surface 92 of the coating formed on or touching a material of the substrate top surface 81. In some cases, coating 74 covers most but not all of top surface 81 of the substrate. In some cases, coating 74 covers all of top surface 81 and extends to edge surfaces 83-86 of the substrate (e.g., to form side surfaces 93-96 of the coating, such as above surfaces 83-86). In some cases coating 74 touches or is partially coated onto a portion of one or more of surfaces 84-86 (e.g., thus forming a portion of side surfaces 93-96 of the coating over a portion of surfaces 84-86). In some cases, coating 74 coats most or all of the edge surfaces 84-86 (e.g., thus forming a portion of side surfaces 93-96 of the coating over all of surfaces 84-86).

Coating 74 may be selected to have a lower work function than that of substrate 76. That is, the coating 74 may require less thermal energy to release electrons than the thermal energy required of the substrate 76. Thus, substrate 76 with the coating 74 requires less thermal energy to release electrons than the thermal energy required of the substrate 76 without coating 74. In certain embodiments, the coating 74 may be manufactured out of materials such as Tungsten or Carburized Tungsten and (e.g., mixed with) Thoria ($ThO_2$, Hafnia ($HfO_2$), or Zirconia ($ZrO_2$). According to some embodiments, coating 74 includes thoriated ditungsten carbide ($ThO_2$ $W_2C$). According to some embodiments, the coating is only thoriated ditungsten carbide ($ThO_2$ $W_2C$). Coating 74 may have between 1 and 5% thoria ($ThO_2$). In some cases, the percentage of thoria is between 1.5% and 2.5% thoria. In some cases, the percentage of thoria is 2% thoria.

Coating 74 is shown having thickness T2. Coating 74 is shown having thickness T2 formed on top of thickness T1 of substrate 76. According to embodiments, the thickness of the substrate T1 may be between 2 and 8 mils (e.g., a mil is 0.001 inches or 1×E-3 inches). In some cases, the strength of the substrate is proportional to the substrate thickness T1 cubed. Therefore a 4 mil (0.004 in. or 4×E-3 inch) thickness T1 of the substrate is 8× stronger than 2 mil thickness of T1. According to embodiments, the thickness of the carburized coating T2 may be between 2 and 45 microns. The coating thickness T2 may have a thickness of between 1 and 100% of the thickness T1 of the substrate. In some cases, a thickness T2 of the coating is between 10 and 75 microns.

Coating 74 may be deposited onto, carburized onto, formed onto, sintered onto, bonded to, annealed to, heat bonded to, adhered to, touching, or otherwise coated on to or upon the top surface 81 of the substrate 76, or the top surface of another substrate (e.g., substrate 76*a*, 76*b*, or 76*c*) as described herein. This process may involve depositing a coating comprising tungsten (W) and thoria ($ThO_2$), then heating it to carburized the tungsten W to form form $W_2C$, such as to form a coating 74 of thoriated ditungsten carbide ($ThO_2$ $W_2C$).

According to embodiments, to form coating 74, first, top surface 81 of the substrate may be coated (e.g., prior to carburizing) with a powder, paste, or slurry of tungsten having between 1 and 5% $ThO_2$. In some cases, a bottom surface of this powder, paste, or slurry is coated directly onto (e.g., touching) top surface 81. In some cases, the coating of tungsten having between 1 and 5% $ThO_2$ may be a laminar or be laminated directly onto (e.g., touching) top surface 81. In some cases, the coating of tungsten and thoria may be formed on a top surface of the substrate by screen printing (e.g., such as for printing on a T-shirt) a slurry of tungsten powder with between 1 and 5% thoria powder. In some cases, the coating may be formed by sputtering, chemical vapor deposition (CVD), Evaporation, Electrophoretic deposition (EPD), Electro-Deposition Coating, or electroplating to coating onto the surface of the substrate.

In some cases, a substrate surface material of tungsten (e.g., surface 81 of substrate 76) has a planar shape (optionally with slots as describe with respect to FIGS. 6-10) that is coated with a powder, laminar, paste, or slurry of tungsten and between 1 and 5% $ThO_2$ (thoria), such as 2% thoria (e.g., prior to carburizing). In some cases the percentage of thoria may be between 1 and 10%. In some cases the percentage of thoria may be between 1 and 3%; 2 and 4%; or 3 and 5%.

According to embodiments, to form coating 74, next, the coating (uncarburized material or coating) may then be carburized. The coating (uncarburized material or coating, previously coated onto surface 81) may then be heated, sintered or fired, in a carburizing atmosphere, such as 1-100 ton methane, to carburize the tungsten W in the coating to form $W_2C$. Thus the coating now includes $W_2C$; and between 1 and 5% $ThO_2$ on top of uncarburized coating which is on top of the substrate. The amount of uncarburized coating depends on the time and temperature of the carburizing process. Consequently, the coating may now be and $W_2C$ and $ThO_2$ on substrate or on uncarburized coating on the substrate. Either way the coating 74 has a lower work function than the tungsten substrate material (e.g., lower than substrate 76).

According to embodiments, the substrate and coating 74 are carburized (1) to form $W_2C$ in the substrate from the W material of the substrate; and (2) to form $W_2C$ and $ThO_2$ in the coating from the W and between 1 and 5% $ThO_2$ material of the coating. In some cases, the substrate and coating are heated, sintered or fired at 1800 degrees Celsius (or between 1800 and 2000 degrees C.) in hydrogen (H2) gas prior to carburization to form coating 74, on or upon the top surface 81 of the substrate in order to improve adhesion of the coating 74 to the substrate 76. According to embodiments, a temperature range for the carburization of coating 74 and substrate 76 is between 1600 and 1900 degrees Celsius. A range of time for carburization or sintering may be between 5 seconds or 5 minutes, depending on the thickness of the coating. Exceeding the temperature for proper carburization may disassociate the thoria and allow the thorium to migrate to the surface too quickly. Such migration may occur during carburization and may occur to a greater degree during use. Carburizing for too long will carburize the entire substrate 76 and may lead to embrittlement and catastrophic cracking of the substrate. Such, cracking of the substrate may occur during the carburization if the temperatures are too high.

According to embodiments, reference to the substrate and coating (e.g., for FIGS. 6-8 and 10) will refer to the carburized substrate and coating. The descriptions above and for FIG. 9 may refer to the uncarburized substrate and coating, when describing forming the carburized coating 74 by first coating the substrate with the uncarburized coating, and then carburizing the coating.

In some cases, the coating is not dense, but is very porous. In some cases the coating (e.g., after carburization) is approximately half voids or pores by volume (e.g., pores filled with nothing, vacuum or air). In some cases the coating is between one half and two thirds pores. In some cases the coating is between one third and two-thirds pores. In some cases the coating is between 40 percent and 60 percent pores. The coating may include separate particles of W and $ThO_2$ having a diameter of approximately 1-5 microns.

In some cases, during use, the cathode, including the carburized substrate or base material 76 and carburized coating 74 are heated such as by running an electrical current between two contacts that are electrically coupled to or touching opposing sides (e.g., surfaces 85 and 86; or opposing corners of surfaces 85 and 86) of the cathode, with current or power sufficient to heat the filament to cause the coating to emit beam 18 (e.g., see openings 79 and/or contacts 101/102). In some cases, the cathode may include grooves or slots to form a longer path for the current and thus reduce the electrical current or power required to sufficiently heat the filament to cause the coating to emit beam 18.

Electron beam 18 is shown emitted from top surface 91 of coating 74. Beam 18 may represent one or more electron beams emitted from the material of coating 74, perpendicular (e.g., tangential) to the top surface 91 of the coating. For example, when sufficiently heated, the carburized coating converts to thorium, carbon monoxide, and tungsten and emits an electron beam generally perpendicular or tangential to the top surface 91 due to the thermionic effect. In some cases, the flat, laminar or laminated top surface 91 of coating 74 allows or causes the emitted electrons to be more easily focused (e.g., to be a "focused electron beam"). The focusing may be done by or due to the focusing electrodes 62 that is caused by the shape of the filament's flat top surface. Since the electrons are all moving in the same direction from the flat surface, it is easier to focus (e.g., emission 18 is more focused in one direction, such as perpendicular to planar surface 91) as compared to a helical emitter in which the electrons are all coming off perpendicular from a coiled surface of a helically shaped cathode (e.g., of a cylindrical shaped wire twisted into a helix which emits the electrons in many directions).

According to embodiments, additional electron beam emissions (e.g., also referred to as beam 18 or a beam similar to beam 18) may be emitted from surfaces of the substrate or filament (or other filaments noted below), other than surface 91. These emissions may be perpendicular (e.g., tangential) to the surface from which they are emitted.

According to embodiments, when heated, the coating 74 emits electrons at a lower, first temperature than the substrate material of substrate 76 due to the lower function of between 2.7 and 3.1 electron volts (eV) of the carburized coating 74, which causes emissions of beam 18 when filament 68 (e.g., substrate 76 and/or coating 74) is heated. In some cases, the heating heats the filament to or at between 1700 and 1900 degrees Celsius. In some cases, the heating heats the filament to or at between 1600 and 2000 degrees Celsius.

According to embodiments, a coating of thoriated ditungsten carbide ($ThO_2W_2C$) is used in or as the coating to create the reaction $ThO_2+2W_2C \rightarrow Th+4W+2CO$, that more quickly reduces or converts Thoria in the coating to Thorium (Th). That is, the ditungsten carbide ($W_2C$) in the coating reduces the thoria in the coating faster than if only tungsten (or only tungsten carbide WC) is in the coating, at temperatures of between 1600 C to 2000 C (e.g., when the filament is heated to these temperatures).

This is as opposed to requiring heating filament 68 (e.g., substrate 76) to or at 2300-2500 degree Celsius to cause emissions of an electron beam from carburized tungsten, without thoria (e.g., substrate 76), which is the emission temperature for tungsten, which has a work function of 4.52 eV. In some cases, the substrate (e.g., of W) has a work function of 4.5 electron volts (eV) (e.g., where the thoria or coating 74 is not present) and has a work function of 3.1 electron volts (eV) where the thoria is present (e.g., where coating 74 exists).

According to embodiments, if only a portion of the top surface 81 is coated with thoria, during use, thorium (Th) generated from or in the coating will diffuse (e.g., migrate, effuse or spread) from the coating, over uncoated surfaces of the substrate. According to embodiments, the uncoated surfaces of the substrate to which the thorium diffuses will also emits electrons (e.g., a "second" beam similar to beam 18) at a lower, first temperature than the substrate material of substrate 76 due to the lower function caused by the diffused thorium. That is the uncoated surfaces of the substrate to which the thorium diffuses may have a work function of between 2.7 and 3.1 electron volts (eV).

This diffusion may be laterally in the x-y direction, over the entire (e.g., all of) uncoated top surface 81 of substrate 76. According to some embodiments, after the thorium (Th) diffuses across all of surface 81, the thorium (Th) will continue to diffuse across other surfaces of the substrate. In cases where all of surface 81 is coated with coating 74, the thorium (Th) generated from the coating will diffuse across edge surfaces of the substrate. This diffusion may take the form of a layer or coating of thorium having a thickness (e.g., less than T2) directly on or touching the surface(s) of the substrate material. The layer or coating may spread outward in a fashion known for such chemical or coating diffusion. It can be appreciated that the farther the thorium diffuses from the coating, the more slowly it will diffuse. Also, as the thorium diffuses farther from the coating, there will be less diffused thorium or a thinner coating of diffused thorium.

More specifically, according to some embodiments, if only a portion (or all) of the top surface 81 is coated with thoria, during use, thorium (Th) will diffuse across the surfaces of substrate 76 from the edges of coating 74. For example, according to embodiments, thorium may spread from coating surfaces 93, 94, 95 and 96 to substrate surfaces 83, 84, 85 and 86, respectively. This diffusion may include diffusion to surface 81 if surface 81 is not completely covered with coating 74, then diffusion to surfaces 83, 84, 85 and 86. In some cases, the thorium that has spread to substrate surfaces 83, 84, 85 and 86, respectively, may then spread from substrate surfaces 83, 84, 85 and 86 to bottom surface 82 of substrate 76. In some embodiments, this diffusion may result in a uniform distribution (e.g., approximately) of the Th atoms over the surface, assuming uniform temperature and uniform surface energy states of the filament.

According to embodiments, as noted above, both the coating and the uncoated surfaces of the substrate to which the thorium diffuses may emit electrons at a lower, first temperature, while the substrate material without the thorium will only emit electrons at a second higher temperature. A reason for this is that the current density J of the electrons emitted from the filament follows the equation (e.g., according to Richardson's equation or equation 1 noted above):

$$J = A_G T^2 e^{-\frac{W}{kT}} \tag{1}$$

where T is the Temperature of the filament or emitting material surface (in Kelvin); W is the work function of the filament or emitting material surface; k is the Boltzmann constant; and $A_G$ is a material specific correction factor which is typically around 60 or 120.

A key to current density J is the exponential dependence of J on W and T. A lower W results in much higher J at the same T. According to embodiments herein, the filament coating reduces the value of W due to Thorium on the filament surface (e.g., surface of the coating having Thorium converted from the Thoria in the coating, and diffused to the surface of the coating), from 4.52 eV for Tungsten (e.g., the substrate without coating or Thorium) to 2.7 to 3.1 eV at the surface of the coating, depending on varying amounts of Thorium on Tungsten or Tungsten Carbide (e.g., of the coating). In some cases, at 1800° C. (2073° K) the emission from a Tungsten surface with diffused Thorium is equal to or approximately 5 A/cm2 while approximately 2500° C. is required for the same current density for plain Tungsten (e.g., without Thorium).

Consequently, it is possible to design and use a coated substrate such as described herein, which emits electrons from the coating (and the uncoated surfaces of the substrate to which the thorium diffuses) at a lower, first temperature, while the substrate material without the thorium would only emit electrons at a second higher temperature. For example, according to some embodiments, filament 68 may be an x-ray cathode filament that includes substrate 76 which can be a planar substrate of tungsten having planar top surface 81, edge surfaces, and a planar bottom surface 82 opposite the planar top surface. Coating 74 including or of carburized tungsten (e.g., $W_2C$ and thoria ($ThO_2$) is disposed or coated upon at least a portion of planar top surface 81 of the substrate. An electron beam (e.g., beam 18) is emitted from the coating through a thermionic effect at a first temperature (e.g., when filament 68 is heated to between 1700 and 1900 degrees Celsius, such as by running a first electrical current between two opposing edges or contacts of the filament or substrate). This electron beam is caused by (1) a reaction that includes creating thorium (Th) in the coating.

In some cases, this reaction includes creating thorium (Th), carbon monoxide (CO) and ditungsten (2W) from the carburized tungsten (e.g., $W_2C$ and thoria ($ThO_2$) of the coating. According to embodiments, when heated, the coating 74 emits electrons at a lower, first temperature than the substrate material of substrate 76 due to the lower function of between 2.7 and 3.1 electron volts (eV) of the carburized coating 74. This is as opposed to requiring heating filament 68 to or above 1900 degrees Celsius, such as to 2300-2500 degree Celsius to cause emissions of an electron beam from carburized tungsten, without thoria (e.g., from surfaces of substrate 76 that are not coated by coating 74).

According to embodiments, when filament 68 is at the first temperature, the thorium (Th) created in the coating diffuses to surfaces of the substrate that are not coated with coating 74 (e.g., are uncoated surfaces of the substrate). This diffusion may cause Thorium to diffuse to uncoated surfaces of surface 81; and/or edge surfaces 83-86 (e.g., if all of surface 81 is coated except for the contacts).

In some cases, an electron beam (e.g., a second beam, similar to beam 18) is emitted from uncoated surfaces of the substrate that the thorium (Th) created through a thermionic effect at the first temperature diffuses to. This second electron beam is caused by (1) a reaction that includes creating thorium (Th) (and optionally carbon monoxide (CO) and tungsten (W) or di-tungsten (2W)) in the coating, and (2) the thorium diffusing to uncoated surfaces of the substrate from which the second beam is also emitted. According to embodiments, the uncoated surfaces of the substrate to which the thorium diffuses will also emit electrons at a lower, first temperature than the substrate material of substrate 76 due to the lower function caused by the diffused thorium, which may be between 2.7 and 3.1 electron volts (eV).

In other words, (3) a second electron beam may be emitted from the uncoated surfaces of the substrate that the thorium diffuses to during or after the thorium is created by or in the coating. It can be appreciated that this diffusion and second electron beam emission at the first temperature may be considered unexpected, and may be an unexpected benefit since more electrons are emitted at the lower temperature than if electrons were only emitted from the coating at that temperature. In some cases, the first and second electron beam may be described as an electron beam emitted from the coating and from the substrate through a thermionic effect at a first temperature, wherein the electron beam emitted from the substrate is caused by (1) a reaction that includes creating thorium (Th), carbon monoxide (CO) and tungsten (W or 2W) in the coating, and (2) the thorium diffusing to uncoated surfaces of the substrate.

In some cases, the first and second electron beam may include an electron beam that emits from the coating through a thermionic effect at a first temperature, wherein the electron beam emitted from the coating is caused by (1) a reaction that includes creating thorium (Th) in the coating, and (2) the thorium diffusing to surface of the coating. In some cases, the first and second electron beam may include a second electron beam can be emitted at the first temperature from uncoated surfaces of the substrate that the thorium diffuses to.

In some embodiments, coating the entire front surface 81 with coating 74 to create surface 91 makes it easier to manufacture the cathode, allows the cathode (e.g., filament) to operate (e.g., emit electrons) over or from the entire front surface 91 at a lower temperature (e.g., than emission where the coating does not exist), and creates no temperature gradient along the top surface 91. Coating the entire front surface 81 may be important or desired because during use the coating converts to Th+2CO+4W and the thorium diffuses to non-carburized portions of the substrate. Therefore, in some cases, it may be important or desired to coat the entire top surface 81 with coating 74 so that thoria does not diffuse away from the top surface, but is homogeneously converted during use across the entire top surface, thus, avoiding "hot spots" or localizations of thoria and electron emission along surface 81 and/or 91.

In some cases, a flat or planar substrate or thermionic filament may be a "substantially" planar substrate or filament, such as a substrate or filament having imperfections in the planarity. Such imperfections may include height variations in the top and bottom surfaces (e.g., 81/82 and/or 91/92), such as (1) due to stress relief when the substrate or filament are cut (e.g., diced from a wafer or sheet of material; and/or cut to form contacts/openings and/or slots), and/or mounted (e.g., using contacts/openings), and/or (2) due to the coating not being perfectly planar. Such height variations may also be due to a difference in thermal expansion between the substrate and the coating, when the filament is carburized or heated during use (e.g., portions, rungs or paths of the filament may "curl up".

According to embodiments, a coated planar filament may be cut into or include slots through the filament to reduce the amount of electrical current required to heat the filament, such as to the first temperature. The slots may divide the filament into a ladder formation having "rungs", into a rectangular spiral formation having current "paths" or into other formation that increases the length of the current path or increases the resistance of the filament. Benefits of using rungs or slots in the substrate may include dividing the substrate into a number of connected flat panels or a switch back path for the current which increases the length the current must travel, therefore requiring less current to heat the same surface area of a filament to the same temperature. In some cases, the more narrow the rungs, the less the current required to heat the same surface area of a filament to the same temperature.

Figure 6:
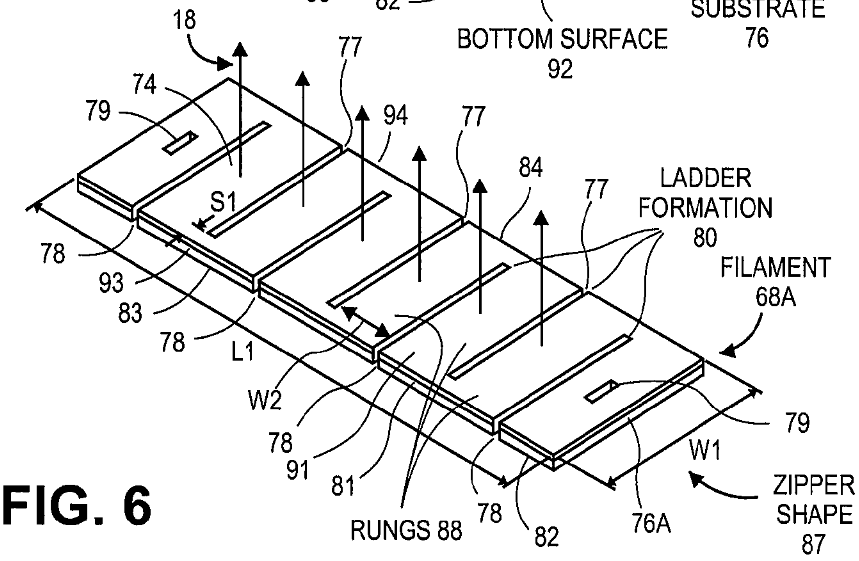
FIG. 6 illustrates one embodiment of a flat or planar thermionic filament substrate having a coating disposed on a top surface of the substrate and slots forming a zipper shape.

FIG. 6 illustrates one embodiment of a flat or planar thermionic filament substrate having a coating disposed on a top surface of the substrate and slots forming a zipper shape. FIG. 6 shows filament 68*a* having slots 77 and 78 in a "ladder" formation 80 and forming a zipper (e.g., zigzag) shape (or pattern) 87 of rungs 88 of the filament. According to some embodiments, filament 68*a* may be a slotted, flat filament 68 with a plurality of slots 77 and 78 extending or cut completely through substrate 76 and coating 74, such as from top surface 91 to bottom surface 82, resulting in a filament 68 having a roughly zipper or zigzag shape of rungs 88 (e.g., portions of the filament between adjacent slots 77 and 78). In some cases the slots extent between and through top surface 91 and bottom surface 82. The slots may be describes as openings, or cuts formed completely through the layers for structure of filament 68 to form filament 68*a*. Filament 68*a* may be a structure similar to and function similar to filament 68 except for having the structure of slots 77 and 78 (and optionally openings 79) and the resulting differences or functions thereof, such as noted below.

According to embodiments, such slots may be formed or cut through the filament by a mechanical saw; a laser; hydro-drill (e.g., a high pressure stream of water); patterned and etched (e.g., as per semiconductor processing). In some cases, the slots may be formed or cut through the filament by laser cutting (e.g., to pattern the slots). Such laser cutting may include exposing only the locations of the slots (e.g., by focusing the laser or moving the laser only on or along surface 81, 82 or 91 at locations or areas where the filament material is not desired or where the slots are to be formed) and vaporizing or burning away the entire thickness of the exposed substrate (e.g., W) where exposed using the laser. In some cases, the laser may impinge only on surface 82 to form the slots.

In some cases, the slots may be formed or cut through the filament by chemical etching (e.g., with an etchant). Such chemical etching may include exposing only the locations of the slots (e.g., by masking surface 81 and 82 or 91 and 92 to protect areas where the filament material is desired or where the slots are not desired) and exposing the masked filament (e.g., non masked portions) to a chemical capable of dissolving the filament (e.g., W; or W and coating). Such chemical etching may include exposing only the locations of the slots (e.g., by spraying or depositing a chemical only on or along surface 81 or 91 at locations or areas where the filament material is not desired or where the slots are to be formed) and vaporizing or burning away the entire thickness of the exposed filament where exposed using the chemical. Such chemical etching may include exposing only the locations of the slots (e.g., by masking surface 81 or 91 to protect areas where the filament material is desired or where the slots are not desired) and exposing the masked filament (e.g., non masked and masked portions) to a chemical (e.g., by spraying, pasting or other deposition) capable of vertically dissolving the thickness of the filament. In some cases, surfaces 81 and 82 are masked; then the masked surfaces are exposed to the chemical to form the slots; and then the substrate with slots is coated and carburized to form the coating.

Ladder formation 80 and rungs 88 may be created by slots 77 along length L1 extending from side surfaces 84 and 94 into the center of the filament; and slots 78 along length L1 extending from side surfaces 83 and 93 into the center of the filament. Ones of slots 78 may alternate with ones of slots 77 (e.g., slots 77 alternate with slots 78) along length L1. The zipper shape 87 of rungs 88 may be formed by alternating of slots 77 and 78. In some cases, substrate 76 of filament 68*a* is cut into the ladder shape (e.g., by forming slots 77 and 78), prior to coating surface 81 with coating 74. In other cases, filament 68*a* is cut into the ladder shape (e.g., by forming slots 77 and 78), after coating surface 81 with coating 74. According to some embodiments, slots 77 and 78 may exist or be disposed through the substrate and the coating, and extend across most of the width W1 of the substrate and the coating to form rungs 88 (e.g., legs) of the substrate and the coating between the slots.

For filament 68*a*, beam 18 may represent one or more electron beams emitted from the material of coating 74, perpendicular to the top surface 91 of the coating, on the rungs. In some cases, filament 68*a* is cut into ladder shape or formation 80 having rungs 88 so that less current is needed to heat the coating to cause emission of electron beam 18 than for filament 68. Slots 77 and 78 may increase the length of the current path and/or increase the resistance of the filament by reducing the cross section of rungs 88 of the filament 68*a* to width W2. In some cases, W2 is between 200 and 1000 microns. In some cases, W2 is equal to L1. In some cases, W2 is between 400 and 600 microns. In some cases, S1 (the width distance from the end of a slot to the end of the rung or S1=W1−slot length in the W1 direction) is between 200 to 1000 microns. In general S1 should be close to W2. If S1 is small compared to W2 then there may be high current density at S1 as the current crowds around the end of the slot. If S1 is larger compared to W2 then there may not be enough heating at the end of the rungs and there will be un-even temperature distribution.

Accordingly, a heating current capable of heating the filament 68*a* may be much reduced (e.g. to values approximately less than 10 A) as compared to filament 68 because the heating current flows through the reduced cross section of width W3 of the rungs instead of across width W1. Such a reduction in the heating current may be important and provide benefits from a system level. Having high filament currents requires that the cathode wiring be designed to accommodate high currents which is expensive. Also, many cathodes in use in the x-ray field now only require 1-7 amps. So increasing the required currents (e.g., by not having slots or having rungs that are to thick) may make obsolete the present supply of power supplies. Conversely reducing the required currents allows this filament to be heated by many x-ray power supplies.

Two openings 79 may be included in the substrate 76 so as to aid in affixing the substrate 76 to the cathode assembly 14. In some cases, openings 79 may be welded to, adhered to, clipped to or otherwise fixed to contacts of assembly 14 which provide power to openings 79. For instance, contacts of assembly 14 may supply an electrical current flow from, or a voltage difference between openings 79, such as to heat or cause filament **68*b*** to become heated by an electrical current, such as described herein.

According to embodiments, when filament **68*a* is at the first temperature, the thorium (Th) created in the coating diffuses to surfaces of the substrate that are not coated with coating 74. This diffusion may cause Thorium to diffuse to uncoated surfaces of surface 81; and/or surfaces 83-86 (e.g., if all of surface 81 is coated except for the contacts). This diffusion may also cause Thorium to diffuse to uncoated surfaces of slots 77 and 78. In some cases, an electron beam (e.g., beam 18) is emitted from uncoated surfaces of the substrate that the thorium (Th) created through a thermionic effect at the first temperature diffuses to such as described above for filament 68**.

Figure 7:
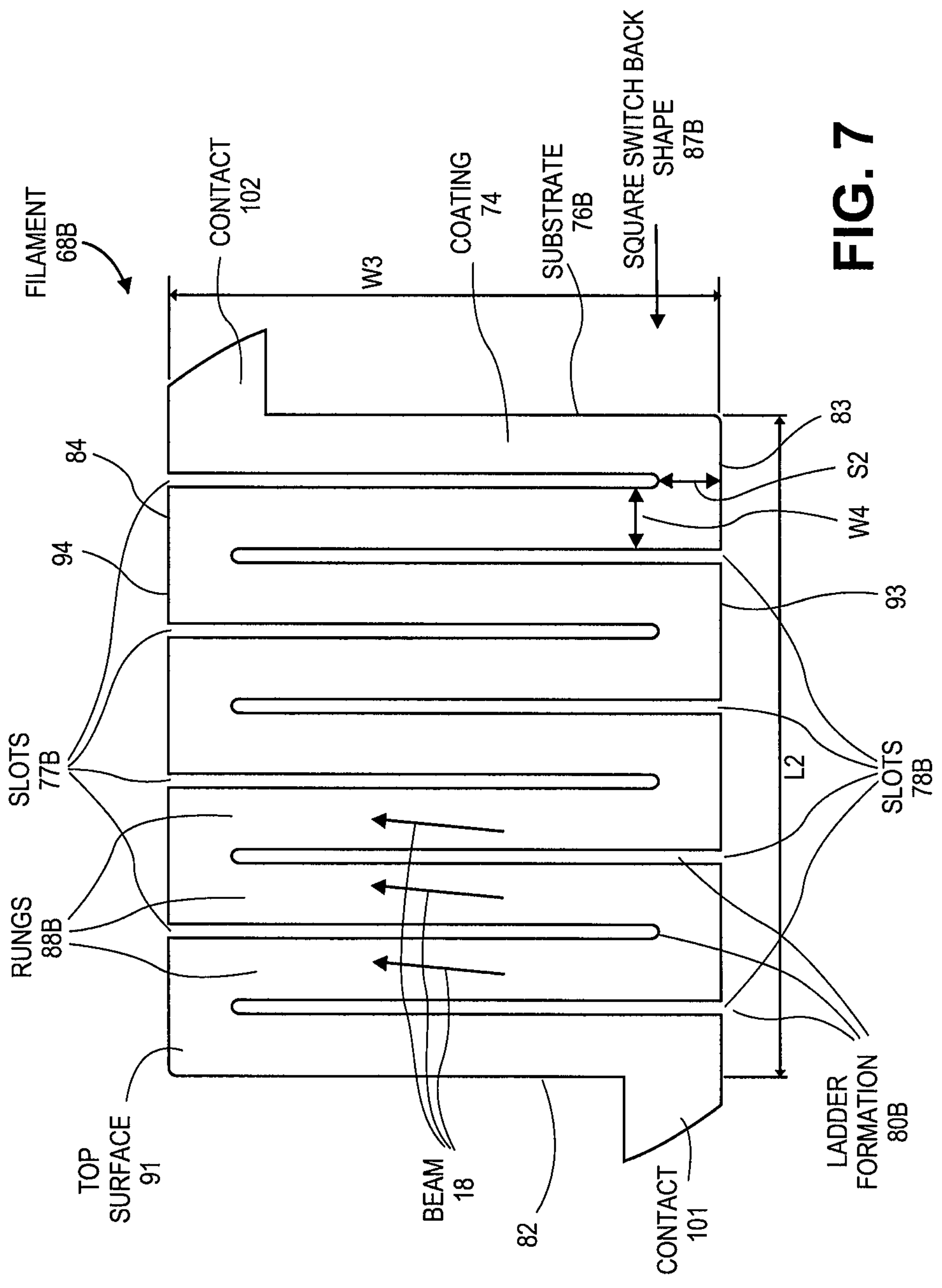
FIG. 7 illustrates one embodiment of a flat or planar thermionic filament substrate having a coating disposed on a top surface of the substrate and slots forming a square switchback shape.

FIG. 7 illustrates one embodiment of a flat or planar thermionic filament substrate having a coating disposed on a top surface of the substrate and slots forming a square switchback shape. FIG. 7 shows filament **68*b* having width W3 and length L2. In some cases, each of L2 and W3 is between 3 mm and 10 mm. In some cases, L2 is equal to W3. In some cases, L2 is greater than W3. Having W3 shorter than L2 may increase geometric stability of the filament (as compared to W3 equal to or greater than L2), because shorter stubbier rungs are more robust than longer narrower rungs. In some cases, each of L2 and W3 are equal to L1 and W1 respectively. In some cases, L2 is between 4000 and 7000 microns. In some cases, L2 is between 5000 and 6000 microns. In some cases, W3 is between 3000 and 6000 microns. In some cases, W3 is between 4000 and 5000 microns. In some cases, any combination of the above numbers may be used for L2 and W3**.

Filament **68*b* has slots 77*b* and 78*b* in a "ladder" formation 80*b* and forming a square switchback (e.g., zigzag) shape (or pattern) 87*b* from rungs 88*b* of the filament. According to some embodiments, filament 68*b* may be a slotted, flat similar to filament 68 (but having width W3 and length L2) with a plurality of slots 77*b* and 78*b* extending or cut completely through substrate 76*b* and coating 74, such as from top surface 91 to bottom surface 82, resulting in a filament 68*b* having a roughly square switchback or zigzag shape of rungs 88*b* (e.g., portions of the filament between adjacent slots 77*b* and 78*b*). In some cases the slots extent between and through top surface 91 and bottom surface 82. The slots may be describes as openings, or cuts form completely through the layers for structure of filament 68 (but having width W3 and length L2) to form filament 68*b***.

Filament **68*b* may be a structure similar to and function similar to filament 68*a* except for having width W3 and length L2; the structure of slots 77*b* and 78*b* (instead of 77 and 78); contacts 101 and 102 (e.g., instead of optional openings 79); and the resulting differences or functions thereof, such as noted below. In some cases, other than as noted herein, substrate 76*b* may be similar to and function similar to substrate 76, except for having width W3 instead of width W1; having length L2 instead of length L1; and having contacts 101 and 102**.

Ladder formation **80*b* and rungs 88*b* may be created by slots 77*b* along length L2 extending from side surfaces 84 and 94 into the center of the filament; and slots 78*b* along length L2 extending from side surfaces 83 and 93 into the center of the filament. Ones of slots 78*b* may alternate with ones of slots 77*b* along length L2. The square switchback shape 87*b* of rungs 88*b* may be formed by alternating of slots 77*b* and 78*b*. In some cases, substrate 76*b* of filament 68*b* is cut into ladder shape 87*b* (e.g., by forming slots 77*b* and 78*b*), prior to coating surface 81 with coating 74. In other cases, filament 68*b* is cut into the ladder shape after coating surface 81 with coating 74. According to some embodiments, slots 77*b* and 78*b* may exist or be disposed through the substrate and the coating, and extend across most of the width W3 of the substrate and the coating to form rungs 88*b*** (e.g., legs) of the substrate and the coating between the slots.

For filament **68*b*, beam 18 may represent one or more electron beams emitted from the material of coating 74, perpendicular to the top surface 91 of the coating, on the rungs. In some cases, filament 68*b* is cut into ladder shape or formation 80*b* having rungs 88*b* so that less current is needed to heat the coating or filament to a certain temperature to cause emission of electron beam 18 than for filament 68 (or 68*a*). Slots 77*b* and 78*b* may increase the length of the current path and/or increase the resistance of the filament by reducing the cross section of rungs 88*b* of the filament 68*b* to width W4, which may be less than width W2. In some cases, W4 is between 400 and 600 microns. In some cases, the width of the slots (e.g., in direction L2**) is between 80 and 120 microns.

Accordingly, a heating current capable of heating the filament **68*b* may be much reduced as compared to filament 68 (and optionally reduced as compared to 68*a*) because the heating current flows through the reduced cross section of width W4 of the rungs instead of across width W1 or W2. Such a reduction in the heating current may result in increased efficiency and lifespan of the filament 68*b* as compared to filament 68 (or 68*a***).

In some cases, slots **77*b* extend into or from side surfaces 84 and 94 into the center of the filament (e.g., across width W3) by a distance of width S2=W3−W4; and slots 78*b* extend into or from side surfaces 83 and 93 into the center of the filament by a distance of width S2=W3−W4. In this case, slots 77*b* and 78*b* cause the width of the turns S2 of the switchback path of filament 68*b* between rungs 88*b* (e.g., at the corners where the slots end) to be width W4 across or at the corners. In some cases, S2 (the width distance from the end of a slot to the end of the rung or S2=W3−slot length in the W3 direction) is between 200 to 1000 microns. In general S2 should be close to W4. If S2 is small compared to W4 then there may be high current density at S2 as the current crowds around the end of the slot. If S2 is larger compared to W4 then there may not be enough heating at the end of the rungs and there will be un-even temperature distribution. For instance, having the width at the corners or turns of the switchback path of filament 68*b* equal to W4** may cause the width of the current path of the filament 68*b* to be maintained or homogeneous at W4 so that the current flow and heating of the current path (and of filament 68*b*) is more consistent than if the width at the corners is not equal to W4. It can be appreciated that this will provide the benefit of more even heating and emission of beam 18; as well as result in increased efficiency and lifespan of the filament 68*b* as compared to filament 68 (or 68*a*), or compared to filament 68*b* without a different width at the corners of the current path of the filament 68*b*. Such a reduction in the heating current may be important and provide benefits from a system level. Having high filament currents requires that the cathode wiring be designed to accommodate high currents which is expensive. Also, many cathodes in use in the x-ray field now only require 1-7 amps. So increasing the required currents (e.g., by not having slots or having rungs that are to thick) may make obsolete the present supply of power supplies. Conversely reducing the required currents allows this filament to be heated by many x-ray power supplies.

According to some embodiments, filament 68*b* or substrate 76*b* has contact 101 disposed at a first (lower left) corner of the substrate (e.g., of top surface 81) and contact 102 disposed at a second (upper right) corner of the substrate (e.g., top surface 81), the first corner opposite the second corner. According to some embodiments, coating 74 of filament 68*b* is not coated on or disposed upon contacts 101 and 102. In some cases, coating 74 of filament 68*b* is coated on or disposed upon a portion of or upon the entirety of the top surface 81 of the filament 68*b* or substrate 76*b*, except for contacts 101 and 102.

Contacts 101 and 102 may be included in the substrate 76*b* so as to aid in affixing the substrate 76*b* to the cathode assembly 14. In some cases, contacts 101 and 102 may be welded to, adhered to, clipped to or otherwise fixed to contacts of assembly 14 which provide power to contacts 101 and 102. For instance, contacts of assembly 14 may supply an electrical current flow from, or a voltage difference between contacts 101 and 102, such as to heat or cause filament 68*b* to become heated by an electrical current, such as described herein.

According to embodiments, when filament 68*b* is at the first temperature, the thorium (Th) created in the coating diffuses to surfaces of the substrate that are not coated with coating 74. This diffusion may cause Thorium to diffuse to uncoated surfaces of surface 81; and/or surfaces 83-86 (e.g., if all of surface 81 is coated except for the contacts). This diffusion may also cause Thorium to diffuse to uncoated surfaces of slots 77*b* and 78*b*. In some cases, an electron beam (e.g., beam 18) is emitted from uncoated surfaces of the substrate that the thorium (Th) created through a thermionic effect at the first temperature diffuses to such as described above for filament 68.

Figure 8:
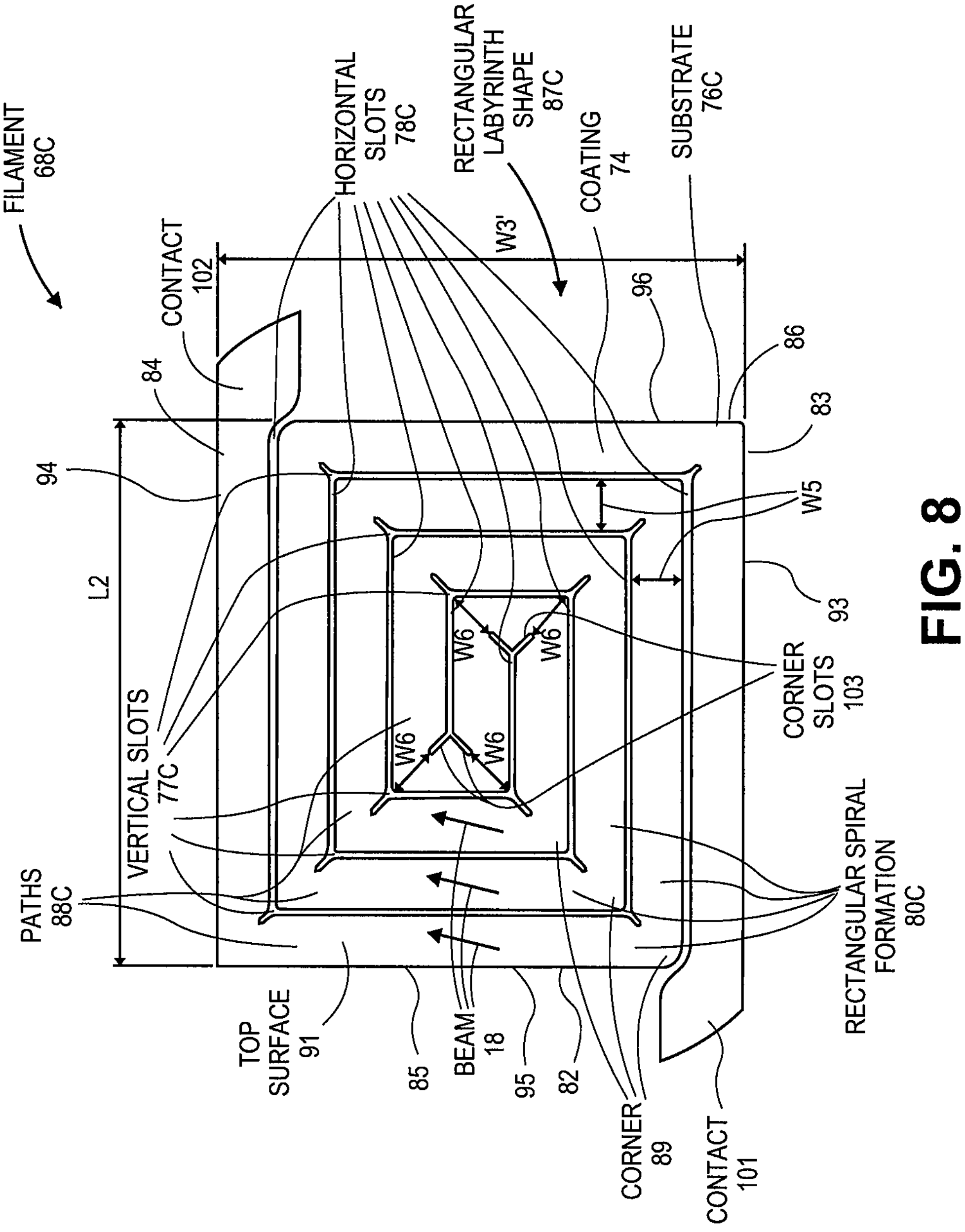
FIG. 8 illustrates one embodiment of a flat or planar thermionic filament substrate having a coating disposed on a top surface of the substrate and slots forming a rectangular labyrinth shape.

FIG. 8 illustrates one embodiment of a flat or planar thermionic filament substrate having a coating disposed on a top surface of the substrate and slots forming a rectangular labyrinth shape. FIG. 8 shows filament 68*c* having width W3' and length L2. In some cases, L2 is longer than W3' by between 1 and 10 percent of L2. In some cases, L2 is 5.4 mm and W3' is 5.19 mm. Filament 68*c* has vertical slots 77*c* and horizontal slots 78*c* in a rectangular "spiral" formation 80*c* and forming a rectangular labyrinth shape (or pattern) 87*c* from paths 88*c* of the filament. According to some embodiments, filament 68*c* may be a slotted, flat similar to filament 68*b* with a plurality of slots 77*c* and 78*c* (e.g., instead of slots 77*b* and 78*b*) extending or cut completely through substrate 76*c* and coating 74, such as from top surface 91 to bottom surface 82, resulting in a filament 68*c* having a roughly rectangular labyrinth shape of paths 88*c* (e.g., portions of the filament between adjacent slots 77*c* or adjacent slots 78*c*). In some cases the slots extent between and through top surface 91 and bottom surface 82. The slots may be describes as openings, or cuts form completely through the layers for structure of filament 68*c* (but having slots 77*c* and 78*c* instead of slots 77*b* and 78*b*) to form filament 68*c*. The slots form corners 89 at the edges or transitions where paths 88*c* turn from extending along width W3' to extending along length L2 or vice versa.

Filament 68*c* may be a structure similar to and function similar to filament 68*b* except for having slots 77*c* and 78*c* (instead of 77*b* and 78*b*); and the resulting differences or functions thereof, such as noted below. In some cases, other than as noted herein, substrate 76*c* may be similar to and function similar to substrate 76*b*, except for having slots 77*c* and 78*c* (instead of 77*b* and 78*b*).

Rectangular spiral formation 80*c* and paths 88*c* may be created by: (1) slots 77*c* along length L2 extending parallel to upper surfaces 85/95 and lower surfaces 86/96, and separated by width W5 along L2 (e.g., as shown); and (2) slots 78*c* along width W3 extending parallel to side surfaces 83/93 and 84/94, and separated by width W5 along W3 (e.g., as shown). In some cases, W5 is between 300 and 1000 microns. In some cases, W5 is between 400 and 600 microns. W5 may be equal to W2 or W4.

The rectangular labyrinth shape 87*c* of paths 88*c* may be formed by two separate rectangular inward spiraling paths starting at contacts 101 and 102 and joining in the middle of the shape or of filament 68*c*. In some cases, substrate 76*c* of filament 68*c* is cut into rectangular labyrinth shape 87*c* (e.g., by forming slots 77*c* and 78*c*), prior to coating surface 81 with coating 74. In other cases, filament 68*b* is cut into the shape after coating surface 81 with coating 74.

For filament 68*c*, beam 18 may represent one or more electron beams emitted from the material of coating 74, perpendicular to the top surface 91 of the coating, on the rungs. In some cases, filament 68*c* is cut into rectangular labyrinth shape 87*c* or spiral formation 80*c* having paths 88*c* so that less current is needed to heat the coating or filament to cause emission of electron beam 18 than for filament 68 (or 68*b*). Slots 77*c* and 78*c* may increase the length of the current path and/or increase the resistance of the filament by reducing the cross section of paths 88*c* of the filament 68*c* to width W5, which may be less than width W4; and to form a longer path for the current or voltage applied to contacts 101 and 102 (e.g., due to paths 88*c* having a rectangular labyrinth shape 87*c* or spiral formation 80*c*, e.g., as compared to rungs 88*b* having shape 87*b* and formation 80*b*). Accordingly, a heating current capable of heating the filament 68*c* to a certain temperature may be much reduced as compared to filament 68 (and optionally reduced as compared to 68*b*) because (1) the heating current flows through the reduced cross section of width W5 of the paths instead of across width W1 or W4; and (2) the heating current flows through the longer path of paths 88*c* having a rectangular labyrinth shape 87*c* or spiral formation 80*c*. Such a reduction in the heating current may result in increased efficiency and lifespan of the filament 68*c* as compared to filament 68 (or 68*b*). It can be appreciated that for some embodiments, shape 87*c* may be a square labyrinth shape or other shape having corners.

In some cases, filament 68*c* includes corner slots 103 at corners 89 or turning points of paths 88*c*. Corner slots 103 may extend through filament 68 similar to slots 77*c*. Corner slots 103 may be similar to slots 77*c* except for being located at the inner corner of one, many or all inner corners of paths

88*c*, and extending outward through a portion of the thickness of the corner, such as is shown. Corner slots 103 may cause the width of paths 88*c* to be width W6 across or at the corners. Width W6 may be equal to or less than width W5. In some cases, W6 is between 300 and 1000 microns. In some cases, W6 is equal to W5. In some cases W6 is selected considering temperature T1 and to allow for some but not to much deformation of the rungs at higher T1 or temperatures greater than T1. For example, without slots 103, the width of paths 88*c* at the corners might be greater than W5 (e.g., to do geometric properties). However, by including slots 103, the width of paths 88*c* may be maintained or homogeneous at width W5 so that the current flow and heating of paths 88*c* is more consistent than without slots 103. It can be appreciated that this will provide the benefit of more even heating and emission of beam 18. Such a reduction in the heating current may be important and provide benefits from a system level. Having high filament currents requires that the cathode wiring be designed to accommodate high currents which is expensive. Also, many cathodes in use in the x-ray field now only require 1-7 amps. So increasing the required currents (e.g., by not having slots or having rungs that are to thick) may make obsolete the present supply of power supplies. Conversely reducing the required currents allows this filament to be heated by many x-ray power supplies In some cases, an optimal current range (e.g., for the filament design) to reach emission temperature may be between 3 and 6 amps. The life of the filament may be improved by increasing the thickness of the rungs (or filament) to give it mechanical stability, but that may increases the current required to heat the filament to emit electrons. Reducing the rung width reduces the required current, but also reduces the mechanical stability. Also there may be an electron optics issue of increasing the number of edges (e.g., such as to greater than that described herein or shown in the figures). The "flat" emitters (e.g., filaments) described herein may assume focusing or using all the electrons coming from a flat surface (e.g., surface 91). In some cases, the focusing or use of electrons coming from edges is not as crisp as from the flat surface. As the number of edges increases, the ratio of electrons from the flat surface and the number from the edges may decrease, distorting the focusing of the electron optics.

According to some embodiments, filament 68*c* or substrate 76*c* has contact 101 disposed at a first (lower left) corner of the substrate (e.g., of top surface 81) and contact 102 disposed at a second (upper right) corner of the substrate (e.g., top surface 81), the first corner opposite the second corner. According to some embodiments, coating 74 of filament 68*c* is not coated on or disposed upon contacts 101 and 102. In some cases, coating 74 of filament 68*c* is coated on or disposed upon a portion of or upon the entirety of the top surface 81 of the filament 68*c* or substrate 76*c*, except for contacts 101 and 102.

Contacts 101 and 102 may be included in the substrate 76*c* so as to aid in affixing the substrate 76*c* to the cathode assembly 14. In some cases, contacts 101 and 102 may be welded to, adhered to, clipped to or otherwise fixed to contacts of assembly 14 which provide power to contacts 101 and 102. For instance, contacts of assembly 14 may supply an electrical current flow from, or a voltage difference between contacts 101 and 102, such as to heat or cause filament 68*c* to become heated by an electrical current, such as described herein.

According to embodiments, when filament 68*c* is at the first temperature, the thorium (Th) created in the coating diffuses to surfaces of the coating and to the surfaces of the substrate that are not coated with coating 74. This diffusion may cause Thorium to diffuse to uncoated surfaces of surface 81; and/or surfaces 83-86 (e.g., if all of surface 81 is coated except for the contacts). This diffusion may also cause Thorium to diffuse to uncoated surfaces of slots 77*c* and 78*c*. In some cases, an electron beam (e.g., beam 18) is emitted from uncoated surfaces of the substrate that the thorium (Th) created through a thermionic effect at the first temperature diffuses to such as described above for filament 68. Also, according to some embodiments, an additional electron beam is emitted from substrate 76 through a thermionic effect at a second temperature such as described above for filament 68.

Moreover, in some cases, by placing contacts on opposing corners of the filament (e.g., see FIGS. 7-8), the length of the current path is also increased and less current is required to heat the filament to emit electrons, than if the contacts are placed on non-opposing corners or on sides of the filament (e.g., see FIGS. 5-6). This also provides the advantage of further separation of the contacts with respect to the surface area of the top surface, which allows easier electrical coupling to the contacts and less possibility of shorting of the connections to the contacts. Having the contacts on the corners might also provide a more uniform emission of the electrodes since heating of the filament may be more uniform.

In some embodiments, openings 79 and/or contacts 101/102 can be placed at other appropriate locations of the substrate. Such locations may include at non-opposing corners; at corners of a same side surface (e.g., of surface 83, 84, 85 or 86); at or along opposing side surfaces (e.g., surface 83 and 84; or 85 and 86); or at or along adjacent side surfaces (e.g., surface 83 and 85; or 84 and 86; etc.). In some cases, contacts 101/102 are also used to provide mounting of the filament onto a cathode head, such as by providing physical support and connection (e.g., aid in affixing) of the filament to the cathode assembly 14, or physical supports of assembly 14.

According to embodiments, slots 77 and 78; 77*b* and 78*b*; or 77*c* and 78*c* (and/or 103) may be formed or cut through the filament by a mechanical saw; a laser; hydro-drill (e.g., a high pressure stream of water); patterned and etched (e.g., as per semiconductor processing). The slots may be formed or cut through the filament by laser cutting, or chemical etching (e.g., to pattern the slots), including as described herein. The slots may be formed prior to coating the substrate; after coating and prior to carburizing the coating; or after carburizing the coating.

As noted above, coating 74 may have thickness T2. However, in some cases, due to a difference in thermal expansion between the substrate and the coating, if the coating is carburized or sintered for too long a time or at too high a temperature, the ladder rungs (e.g., rungs 88, rungs 88*b* or paths 88*c*) will curl up during sintering. Similarly, in some cases, if the coating is too thick (e.g., more than 1.5 times T2), the rungs (e.g., rungs 88, rungs 88*b* or paths 88*c*) will curl up during use.

Although FIGS. 6-8 show certain formations of the slots and shapes of the rungs/paths, it is considered that other formations of the slots and shapes of the rungs/paths may be used. In some cases the formation may create rungs/paths in a circular, oval, square, rectangular, wave, ladder, zipper, or other shape.

Although FIGS. 6-8 generally show coating 74 on top surface 81 of the substrate, according to some embodiments, the coating 74 on the substrate top surface 81 may also be coated onto the substrate bottom surface 82. In some cases, the coating 74 may be coated onto all substrate surfaces, except for the electrical contacts. Such coating may reduce the "bi-metallic" effect of having coating on only surface 81. This effect, may be a difference in metals and thermal properties between the planar surfaces of coating and the substrate, which is reduced when the top and bottom surfaces of the substrate are coated.

In some cases, emitters 68, 68*a*, 68*b* and 68*c* may be considered surface emitters; or emitters that are not bulk emitters.

Figure 9:
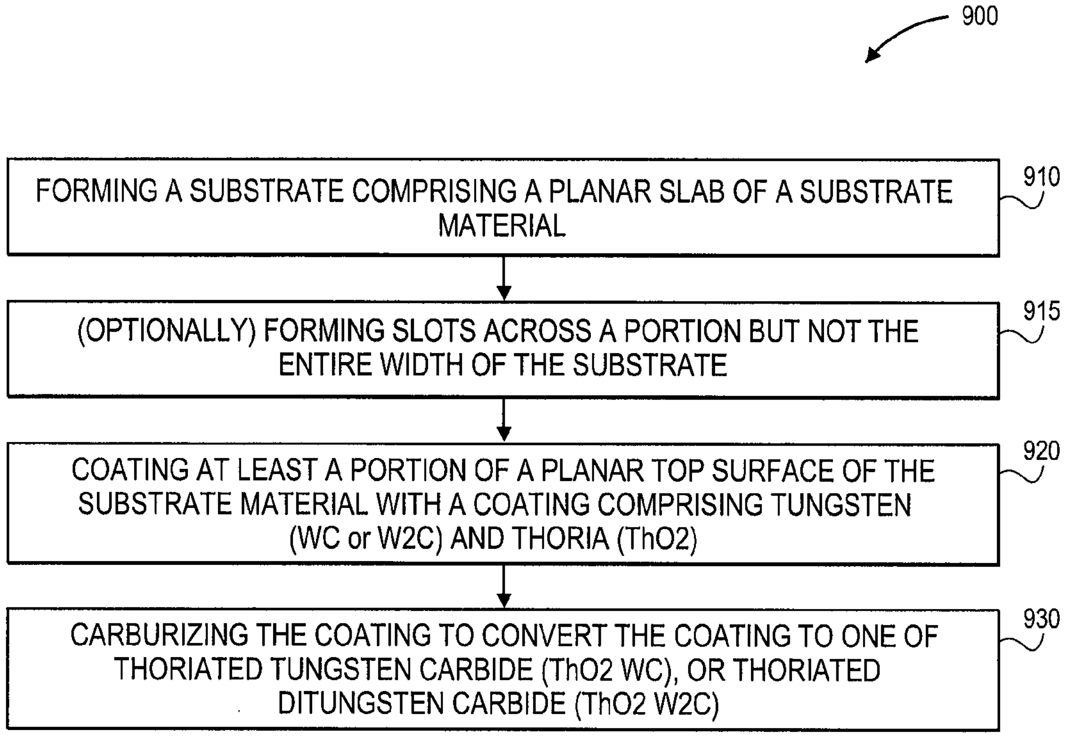
FIG. 9 illustrates one embodiment of a process for forming a flat or planar thermionic filament substrate having a coating disposed on a top surface of the substrate.

FIG. 9 illustrates one embodiment of a process for forming a flat or planar thermionic filament substrate having a coating disposed on a top surface of the substrate. FIG. 9 shows process 900 for forming a flat or planar thermionic cathode filament substrate having a coating disposed on a top surface of the substrate. Process 900 may be or include a process for forming filament 68, 68*a*, 68*b* or 68*c*.

At block 910, a substrate comprising a planar substrate of a substrate material is formed. In some cases, the substrate material is or comprises Tungsten. In some cases, the substrate comprises a planar top surface, parallel left and right side surfaces, parallel upper and lower surfaces, and a planar bottom surface opposite the planar top surface of the substrate material. Block 910 may include descriptions above for forming substrate 76, 76*a*, 76*b* or 76*c*.

At optional block 915, slots are formed across a portion but not the entire width of the substrate. In some cases, the slots may be formed in one of a ladder formation or a rectangular spiral formation. Block 915 may include descriptions above for forming slots 77 and 78; slots 77*b* and 78*b*; or slots 77*c* and 78*c* (e.g., of filament 68, 68*a*, 68*b* or 68*c*). Block 915 is optional and my or may not be performed in a process including any or all of the other blocks of process 900.

At block 920, at least a portion of a planar top surface of the substrate material is coated with a coating comprising tungsten and thoria. This may include coating the substrate after block 910 or the optional substrate having slots, after block 915. The coating may be a powder or slurry of tungsten (e.g., W) and between 1 and 5 percent thoria (ThO2). In some cases, coating includes printing the powdered mixture on the most or all of the planar top surface of substrate 76, 76*a*, 76*b* or 76*c* (e.g., except for substrate contacts). Coating may include depositing a coating of a powder, a paste, a slurry, a laminate or a screen printing of coating of tungsten having between 1 and 5% ThO2 (thoria) directly onto a top surface of the substrate. Block 920 may include descriptions above for forming coating 74 (e.g., prior to carburization) of filament 68, 68*a*, 68*b* or 68*c*.

At block 930, the coating is carburized or sintered. Block 930 may include heating the coating at a temperature and for a period of time sufficient to convert the coating to thoriated ditungsten carbide ($ThO_2$ $W_2C$). Block 930 may include heating the substrate in a carburizing atmosphere, such as a partial pressure of Methane or Hexane, to carburize tungsten W to form $W_2C$; and heating the coating to cause the coating to form thoriated ditungsten carbide ($ThO_2$ $W_2C$). In some cases, block 930 includes heating the coating to cause the coating to form a chemical reaction which (1) converts the $2W_2C+ThO_2$ into Th and 2CO+4W. Block 930 may include descriptions above for forming coating 74 (e.g., after carburization) of filament 68, 68*a*, 68*b* or 68*c*.

According to embodiments, block 910, 915 or 920 is not performed or is not part of process 900. In some cases, blocks 910, 915 and 920 are not performed or are not part of process 900. In some cases, only block 930 is performed for process 900. In some cases, block 915 is performed after block 920 or 930.

According to some embodiments, a process for forming a flat or planar thermionic filament substrate having a coating disposed on a top surface of the substrate may include performing block 915 prior to block 930. For example, a cathode filament may include a tungsten substrate that is already coated with Thoria ThO2 (or optionally coated with Thoria and tungsten). The coating may have been performed for formed as noted for block 920, but to produce a coating of only Thoria on the substrate (or optionally coated with Thoria and tungsten and noted for block 920). The already coated substrate may subsequently be patterned or otherwise processed to form slots as noted at block 915. The coated and slotted substrate may then be carburized as noted at block 930 to form filament 68*a*, 68*b* or 68*c*. Block 910 or 920 may not be performed or not be part of this process. In some cases, blocks 910 and 920 are not performed or are not part of this process. In some cases, only blocks 930 and 915 are performed for this process. In some cases, only block 930 is performed for this process.

Figure 10:
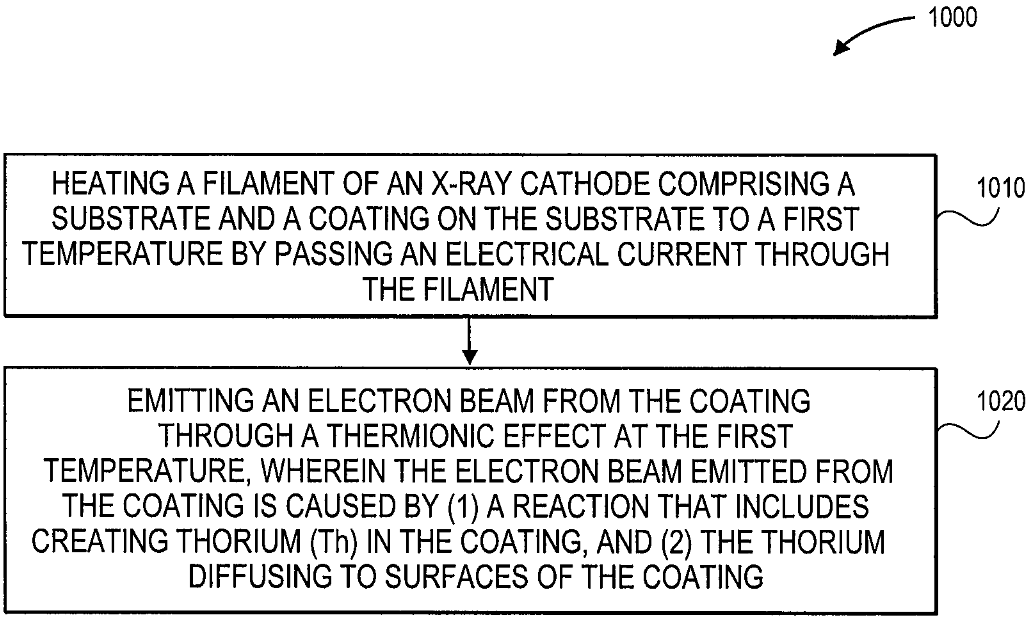
FIG. 10 illustrates one embodiment of a process for operating or using a flat or planar thermionic filament substrate having a coating disposed on a top surface of the substrate.

FIG. 10 illustrates one embodiment of a process for operating or using a flat or planar thermionic filament substrate having a coating disposed on a top surface of the substrate. FIG. 10 shows process 1000 for operating or using a flat or planar thermionic cathode filament substrate having a coating disposed on a top surface of the substrate. Process 1000 may be or include a process for operating or using filament 68, 68*a*, 68*b* or 68*c*.

At block 1010, a filament of an x-ray cathode comprising a substrate and a coating on the substrate is heated to a first temperature by passing an electrical current through the filament. Block 1010 may include heating carburized substrate or base material 76, 76*a*, 76*b* or 76*c* and carburized coating 74 (e.g., of filament 68, 68*a*, 68*b* or 68*c*) such as by running an electrical current between two contacts that are electrically coupled to or touching opposing sides (e.g., surfaces 85 and 86; or opposing corners of surfaces 85 and 86) of the filament with sufficient current or power to heat the filament to cause the coating to emit beam 18. Block 1010 may include descriptions herein for heating a filament to a first temperature, or sufficiently to cause block 1020 to occur. In some cases, the cathode may include grooves or slots to reduce the electrical current or power required to sufficiently heat the filament to cause the coating to emit beam 18, for heating a filament to a first temperature, or sufficiently to cause block 1020 to occur.

At block 1020 an electron beam is emitted from the coating and from the substrate through a thermionic effect at the first temperature, wherein the electron beam emitted from the substrate is caused by (1) a reaction that includes creating thorium (Th) in the coating, and (2) the thorium diffusing to uncoated surfaces of the substrate. In some cases, block 1020 may include block 1010. Block 1020 may include descriptions herein for heating a filament to a first temperature, or sufficiently to cause a reaction that includes creating thorium (Th) in the coating. Block 1020 may include emitting an electron beam (e.g., beam 18) from the coating through a thermionic effect at a first temperature (e.g., when filament 68 is heated to between 1700 and 1900 degrees Celsius, such as by running a first electrical current between two opposing edges or contacts of the filament or substrate). This electron beam is caused by (1) a reaction that includes creating thorium (Th) in the coating. Block 1020 may include heating filament 68 to a first temperature at which thorium (Th) created in the coating diffuses to surfaces of the substrate that are not coated with coating 74 as noted herein.

In some cases, block 1020 includes that an electron beam emits from the coating through a thermionic effect at a first temperature, wherein the electron beam emitted from the coating is caused by (1) a reaction that includes creating thorium (Th) in the coating, and (2) the thorium diffusing to surface of the coating. In some cases, block 1020 includes that a second electron beam can be emitted at the first temperature from uncoated surfaces of the substrate that the thorium diffuses to.

In some cases, block 1020 may include emitting an electron beam (e.g., beam 18) from uncoated surfaces of the substrate that the thorium (Th) created through a thermionic effect at the first temperature diffuses to as noted herein. This electron beam may be caused by (1) a reaction that includes creating thorium (Th) (and optionally carbon monoxide (CO) and tungsten (W or 4W)) in the coating, and (2) the thorium diffusing to uncoated surfaces of the substrate from which beam 18 is also emitted. In other words, (3) an electron beam may be emitted from the uncoated surfaces of the substrate that the thorium diffuses to during or after the thorium is created by or in the coating. In some cases, the cathode may include grooves or slots to reduce the electrical current or power required to sufficiently heat the filament to cause the coating to emit an electron beam to be emitted from the thorium that diffuses to uncoated surfaces of the substrate, for heating a filament to a first temperature, or sufficiently to cause block 1020 to occur.

According to some embodiments, block 1010 or 1020 is not performed or is not part of process 1000.

According to embodiments, where the coating has a work function of approximately 3.5 electron volts (eV), the emitted electron current density (i.e., a measure related to the number and density of electrons emitted per surface area of the filament) may improve by a factor of approximately one hundred (e.g., for $ThO_2$+WC coating) when compared to a traditional uncoated tungsten filament at the same temperature (e.g., substrate 76 of W without coating 74). Accordingly, the coated filaments 68, 68*a*, 68*b* and 68*c* may produce significantly more electrons and a more powerful electron beam 18 when compared to the electron beam produced by a traditional filament at the same temperature. Additionally, the coating 74 may be selected to be resistant to certain gases that may be present in the X-ray tube assembly 58 as well as to back-bombardment of ions (e.g., rebounding electrons), resulting in a coating 74 that has a long operational life.

In addition, in some cases, rungs may be added to the filament, which may not lower the power or temperature of the emitter, but may reduce the current required to get to the emission temperature (which does not change due to the rungs). An importance of lowering the current may be that most x-ray tubes now in operation use a coiled filament that needs from 2-6 amps of filament current to be heated to emit electrons. In some designs, a flat emitters without rungs (e.g., without slots) may require 20-40 amps of current to get to a temperature to emit electrons. The voltage across the filament would be very low during emission, but the power=(Current×Voltage) would be approximately the same as needed with the rungs. However, the system wiring (e.g., connected or electrically coupled to ends of the filament, such as contacts 79 or 101/102) required to run that high a current would require many system level changes from those used for most x-ray tubes. By adding the rungs, embodiments provide a filament that emits electrons at currents down to below 8 Amps or as low as 6 amps, which is acceptable for most x-ray systems.

Also, in some cases, using fewer rungs (such as the numbers of rungs described herein or shown in FIGS. 5-8) reduces the number of filament edges (as compared to using more rungs), so that there is less emission from the edges, which cause degraded electron optics. Also as the number of rungs increases (e.g., from what is described herein) the area in the gap region between the rungs can become significant, meaning there is less emitting area so the temperatures would need to be increased and that could reduce the filament life of a coated emitter by using up the thoria at the higher temperature. In addition, as the rungs become narrower (such as compared to the width of the rungs described herein), the mechanical strength of the filament is reduced.

Further, the filament's 68, 68*a*, 68*b* and 68*c* thermionic temperature (i.e., temperature at which electron emissions occur) may be regulated so that the coating 74 and not the substrate may act as the primary emissive layer of the electron beam 18. Accordingly, the temperature of the filament 68, 68*a*, 68*b* and 68*c* may be set at a value, for example a value approximately 400 or 600 degrees Celsius lower than the value set for a traditional filament. Using lower operating temperatures may also be advantageous in prolonging the life of the coated filament 68, 68*a*, 68*b* and 68*c*. Filament 68, 68*a*, 68*b* and 68*c* failure is traditionally driven by evaporation of the filament 68, 68*a*, 68*b* and 68*c* material during thermionic operations. In high vacuum conditions, such as those found inside the X-ray tube assembly 58, material loss can be proportional to the vapor pressure of the evaporating material. Vapor pressure of the coating 74 embodiments such as coatings 74 containing $W_2C$ and $ThO_2$, may, in some cases, be six-fold lower than that of traditional tungsten filaments at the same thermionic emission density. Accordingly, the life of the coated filament 68, 68*a*, 68*b* and 68*c* may be substantially increased because the filament 68, 68*a*, 68*b* and 68*c* may exhibit less material evaporation.

Another advantage of using chemicals such as $W_2C$ and $ThO_2$, and their derivatives, is that the resulting coating 74 may be very stable when disposed on the substrate 76. That is, the filament 68, 68*a*, 68*b* and 68*c* may be exposed to high temperatures, for example temperatures exceeding approximately 2300-2500 degrees Celsius, without the coating 74 melting or forming alloys or solutions with the underlying substrate. Indeed, adding coating 74 may provide benefits of electron emission in a reaction vs. temperature process that occurs while the filament is below 2100° C. Further, embodiments of the coating 74 may exhibit congruent evaporation, that is, the ratio of certain chemicals in the coating such as the thoria to carbon ratio may stay constant during evaporation. Accordingly little or no variation in thermionic electron emissions may occur due to changes in chemical composition.

The x-ray cathode, filament and/or system disclosed herein may be used in several important applications. Such applications include CT, cone beam CT, kV and MV imaging of patients, anatomy and cancer tumors. Such imaging may be performed during treatment, treatment planning, treatment simulation, treatment setup and treatment verification. For instance, x-ray imagers, such as described herein may be used to provide CT images (e.g., from kV source) used to generate or modify a treatment plan. They may also be used to provide CT images used during treatment simulation or treatment, such as to position a patient. These coating can also be used in x-ray tubes used for industrial uses, especially where the lower filament temperatures lower the temperature of the external housing of the tube.

In some embodiments herein, "above", "below" and/or "between" may refer to "vertical" direction (e.g., see beam 18, as shown in FIG. 5). Also, "horizontal" and/or "adjacent" may refer to lateral direction (e.g., see length L1 and Width W1, as shown in FIG. 5). In some cases "sheet" may refer to a horizontally planar or flat piece of material having a certain vertical thickness.

It should be noted that references to "an" or "one" embodiment of the invention in this disclosure are not necessarily to the same embodiment, and they mean at least one. The terms "top", "bottom", "front", "back", "above", "below", "upper", "over", "under", "middle", "lower", and "between" as used herein refer to a relative position of one layer or component with respect to another in a particular orientation as illustrated but do not imply any absolute orientation in space. Moreover, in some cases, one layer deposited or disposed above or below another layer, or between layers, may be directly in contact with (e.g., touching) the other layer(s) or may have one or more intervening layers. The term "coupled" as used herein means connected directly to or connected indirectly through one or more intervening layers or operatively coupled through non-physical connection (e.g., optically).

The foregoing description of embodiments of the invention has been presented to illustrate the principles of the invention and not to limit the invention to the particular embodiment illustrated. It will, however, be evident that various modifications and changes may be made thereto without departing from the broader spirit and scope of embodiments of the present invention. For instance, X-ray imager devices, methods of imager fabrication, methods of imager use, means for performing imager functions, imager systems, and other uses of the imager technologies described herein are considered as possible embodiments of the invention. Moreover, the foregoing materials are provided by way of example as they represent the materials used in an electron emitting x-ray cathode or filament. It will be appreciated that other electron emitting filament materials; or other materials or additives may be used for the electron emitting x-ray cathode or filament. For example, according to other embodiments, the Thoria ($ThO_2$) in the coating on the substrate may be replaced with Zirconia ($ZrO_2$), or ($ZrO_2$), or Hafnia ($HfO_2$), which is then carburized (e.g., as described above). In some cases this coating may be Tungsten (e.g., W or $W_2$) and $ZrO_2$; or Tungsten and $HfO_2$, which is then carburized (e.g., to form WC or $W_2C$; and $ZrO_2$ or $HfO_2$). The present specification and Figures are accordingly to be regarded as illustrative rather than restrictive. It is intended that the scope of the invention be defined by all of the embodiments encompassed within the following claims and their equivalents.

What is claimed is:

1. An x-ray cathode filament comprising:

a substrate comprising a planar substrate of a substrate material; and a coating comprising carburized tungsten ($W_2C$) and thoria ($ThO_2$) disposed upon a first surface the substrate;

wherein a first electron beam emits from the coating through a thermionic effect at a first temperature, wherein a second electron beam emits at the first temperature from uncoated surfaces of the substrate that the thorium diffuses to.

2. The filament of claim 1, wherein the first electron beam that emits from the coating is caused by (1) a reaction that includes creating thorium (Th) in the coating, and (2) the thorium diffusing to surface of the coating.

3. The filament of claim 1, wherein the coating comprises thoriated ditungsten carbide ($ThO_2$ $W_2C$); and wherein when heated to the first temperature, the coating converts to thorium (Th), carbon monoxide (CO) and tungsten (W or 4W).

4. The filament of claim 3, wherein coating comprises a coating of thoriated ditungsten carbide ($ThO_2$ $W_2C$) having between 1 and 5% thoria ($ThO_2$); and the coating is coated directly on a top surface of the substrate.

5. The filament of claim 1, wherein the thorium diffusing to surfaces of the substrate includes the thorium diffusing to surfaces of the substrate adjacent to the coating; including the substrate parallel left and right side surfaces of the substrate, parallel upper and lower surfaces of the substrate, and a planar bottom surface of the substrate opposite the planar top surface.

6. The filament of claim 1, wherein the substrate includes electrical contacts and the coating is disposed upon all of the planar top surface of the substrate except for the contacts, and wherein the reaction that includes creating thorium (Th), carbon monoxide (CO) and quadtungsten (4W) in the coating.

7. The filament of claim 6, wherein the electrical contacts comprise a first contact disposed at a first corner of the top surface and a second contact disposed at a second corner of the top surface, the first corner opposite the second corner.

8. The filament of claim 1, further comprising slots through the substrate and the coating, the slots extending across most of a width of the substrate and the coating to form rungs or paths of the substrate and the coating between the slots.

9. The filament of claim 8, wherein the slots form a zipper shape, a square switchback shape, or a rectangular labyrinth shape to reduce the current required to heat the filament.

10. The filament of claim 1, wherein the coating has a work function of 3.1 electron volts and the substrate material has a work function of 4.5 electron volts.

11. A method of manufacturing an x-ray cathode filament comprising:

forming a substrate comprising a planar substrate of a substrate material comprising tungsten;

coating a planar top surface of the substrate material with a coating comprising tungsten (W) and thoria ($ThO_2$); and carburizing the coating to convert the coating to thoriated ditungsten carbide ($ThO_2$ $W_2C$).

12. The method of claim 11, wherein coating comprises depositing a coating of a powder, a paste, a slurry, a laminate or a screen printing of coating of tungsten having between 1 and 5% thoria ($ThO_2$) directly onto a top surface of the substrate.

13. The method of claim 11, wherein carburizing comprises heating the substrate to carburize the tungsten in the substrate to form ditungsten carbide ($W_2C$); and heating the coating to form thoriated ditungsten carbide ($ThO_2$ $W_2C$).

14. The method of claim 11, further comprising forming slots across a portion but not the entire width of the filament, wherein the slots are formed in one of a ladder formation or a rectangular spiral formation.

15. A method of manufacturing an x-ray cathode filament comprising:

forming slots across a portion but not the entire width of a filament comprising a substrate and a coating on the substrate, wherein the substrate comprises a planar substrate of substrate material, and wherein the coating comprises tungsten (W) and thoria ($ThO_2$) disposed upon a planar top surface the substrate; and carburizing the coating to convert the coating to thoriated ditungsten carbide ($ThO_2$ $W_2C$).

16. The method of claim 15, wherein the slots are formed in one of a ladder formation or a rectangular spiral formation and wherein coating comprises a coating of thoriated ditungsten carbide ($ThO_2$ $W_2C$) having between 1 and 5% thoria ($ThO_2$) and is coated directly on a top surface of the substrate.

17. A method of emitting an electron beam from an x-ray cathode filament comprising:

heating a filament to a first temperature, wherein heating comprises passing an electrical current through the filament, the filament comprising a substrate and a coating on the substrate;

wherein the substrate comprises a planar substrate of substrate material; and wherein the coating comprises carburized tungsten ($W_2C$) and thoria ($ThO_2$) disposed upon a planar top surface the substrate; and wherein heating the filament to the first temperature causes the electron beam to be emitted from the coating through a thermionic effect at the first temperature, wherein the electron beam emitted from the coating is caused by (1) a reaction that includes creating thorium (Th) in the coating, and (2) the thorium diffusing to surfaces of the coating.

18. The method of claim 17, further comprising emitting a second electron beam from uncoated surfaces of the substrate that the thorium diffuses to.

19. The method of claim 17, wherein heating the filament includes passing an electrical current through the filament, and the first temperature is between 1600 and 1900 degrees Celsius.

20. The method of claim 17, wherein the emitted electron beam is a focused electron beam emitted perpendicular a top surface of the coating, and wherein the first temperature is less than a temperature required to emit an electron beam from tungsten.

21. A filament comprising:

a means for emitting an electron beam through a thermionic effect at a first temperature from a coating on a substrate, the beam caused by (1) a reaction that includes creating thorium (Th) in the coating, and (2) the thorium diffusing to surface of the coating; and a means for emitting a second electron beam at the first temperature from uncoated surfaces of the substrate that the thorium diffuses to.

* * * * *